US011287782B2

(12) United States Patent
Ohmori et al.

(10) Patent No.: US 11,287,782 B2
(45) Date of Patent: Mar. 29, 2022

(54) COMPUTER, METHOD FOR DETERMINING PROCESSING CONTROL PARAMETER, SUBSTITUTE SAMPLE, MEASUREMENT SYSTEM, AND MEASUREMENT METHOD

(71) Applicant: Hitachi, Ltd., Tokyo (JP)

(72) Inventors: Takeshi Ohmori, Tokyo (JP); Hyakka Nakada, Tokyo (JP); Masaru Kurihara, Tokyo (JP); Tatehito Usui, Tokyo (JP); Naoyuki Kofuji, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 560 days.

(21) Appl. No.: 15/966,034

(22) Filed: Apr. 30, 2018

(65) Prior Publication Data

US 2019/0064755 A1  Feb. 28, 2019

(30) Foreign Application Priority Data

Aug. 31, 2017 (JP) .............................. JP2017-166813
Oct. 31, 2017 (JP) .............................. JP2017-210346

(51) Int. Cl.
*G05B 13/04* (2006.01)
*G06F 17/18* (2006.01)
(Continued)

(52) U.S. Cl.
CPC ....... *G05B 13/041* (2013.01); *G05B 13/0265* (2013.01); *G06F 17/18* (2013.01); *G06F 30/20* (2020.01); *G06N 20/00* (2019.01)

(58) Field of Classification Search
CPC ..... G06F 30/17; G06F 17/18; G05B 13/0265; G05B 13/041

(Continued)

(56) References Cited

U.S. PATENT DOCUMENTS 7,372,583 B1   5/2008 Jin et al.
2008/0255786 A1  10/2008 Jin et al.
(Continued)

FOREIGN PATENT DOCUMENTS

JP   2007-173334 A   7/2007
JP   2008-218709 A   9/2008
(Continued)

OTHER PUBLICATIONS

Japanese-language Office Action issued in Japanese Application No. 2017-210346 dated Mar. 2, 2021 (10 pages).

*Primary Examiner* — Thai Q Phan
(74) *Attorney, Agent, or Firm* — Crowell & Moring LLP

(57) ABSTRACT

A computer for determining a control parameter of processing to be performed on a sample includes: a memory unit configured to store a first model indicating a correlation between a first processing output obtained by measuring a first sample used for manufacturing, on which the processing is performed and a second processing output obtained by measuring a second sample that is easier to measure than the first sample and on which the processing is performed, and a second model indicating a correlation between a control parameter of the processing performed on the second sample and the second processing output; and an analysis unit configured to calculate a target control parameter of the processing performed on the first sample based on a target processing output as the target first processing output, the first model, and the second model.

10 Claims, 25 Drawing Sheets

(51) Int. Cl.
  *G06N 20/00* (2019.01)
  *G05B 13/02* (2006.01)
  *G06F 30/20* (2020.01)

(58) Field of Classification Search
  USPC .......................................................... 703/2, 6
  See application file for complete search history.

(56) References Cited

U.S. PATENT DOCUMENTS

| | | | |
|---|---|---|---|
| 2008/0255801 A1 | 10/2008 | Jin et al. | |
| 2009/0117259 A1 | 5/2009 | Kataoka et al. | |
| 2018/0284746 A1* | 10/2018 | Cella ..................... | H04L 1/0041 |
| 2018/0284753 A1* | 10/2018 | Cella ...................... | G06N 20/00 |
| 2018/0321667 A1* | 11/2018 | Cella ................... | G05B 23/024 |
| 2018/0321672 A1* | 11/2018 | Cella ................ | G05B 19/41845 |

FOREIGN PATENT DOCUMENTS

| | | |
|---|---|---|
| JP | 2009-43900 A | 2/2009 |
| JP | 2009-44125 A | 2/2009 |

\* cited by examiner

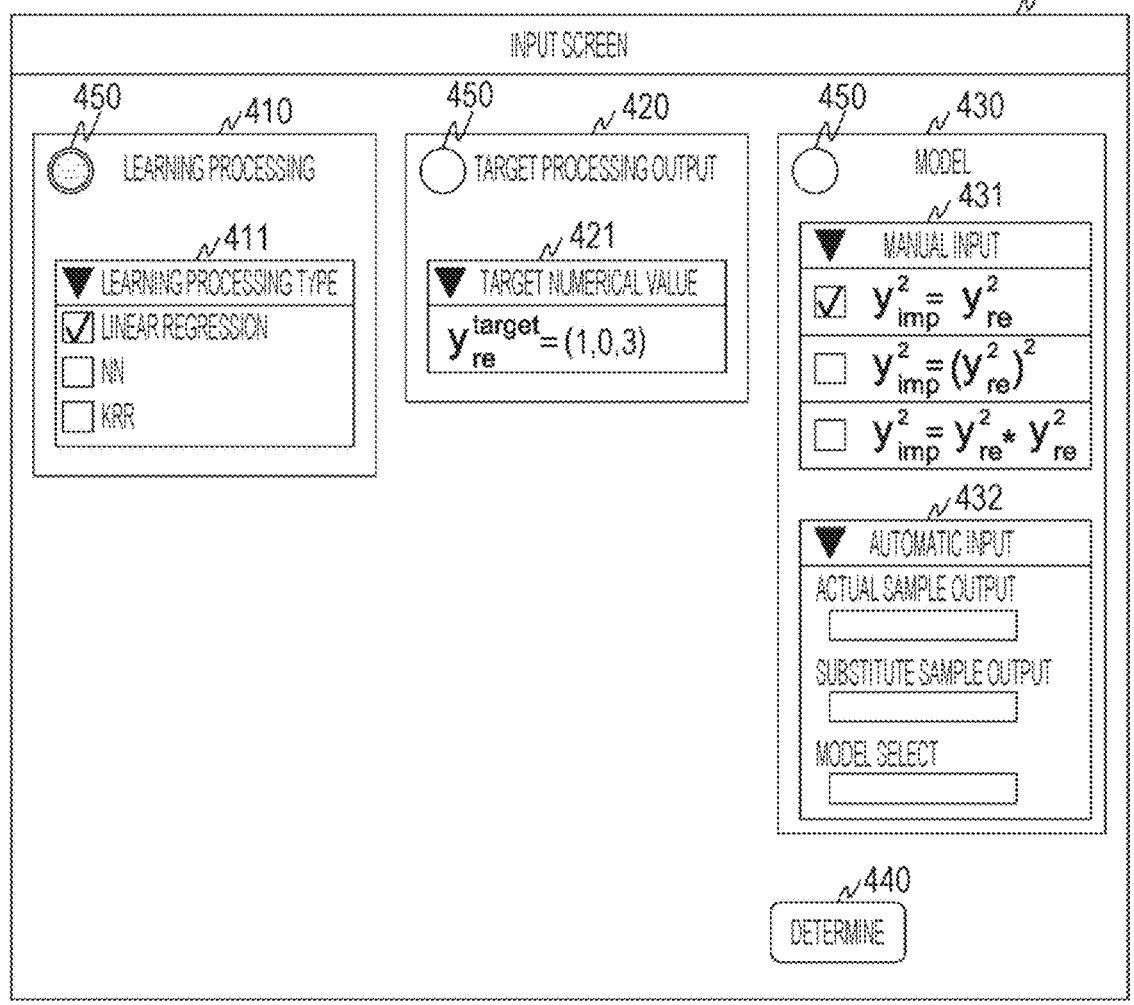

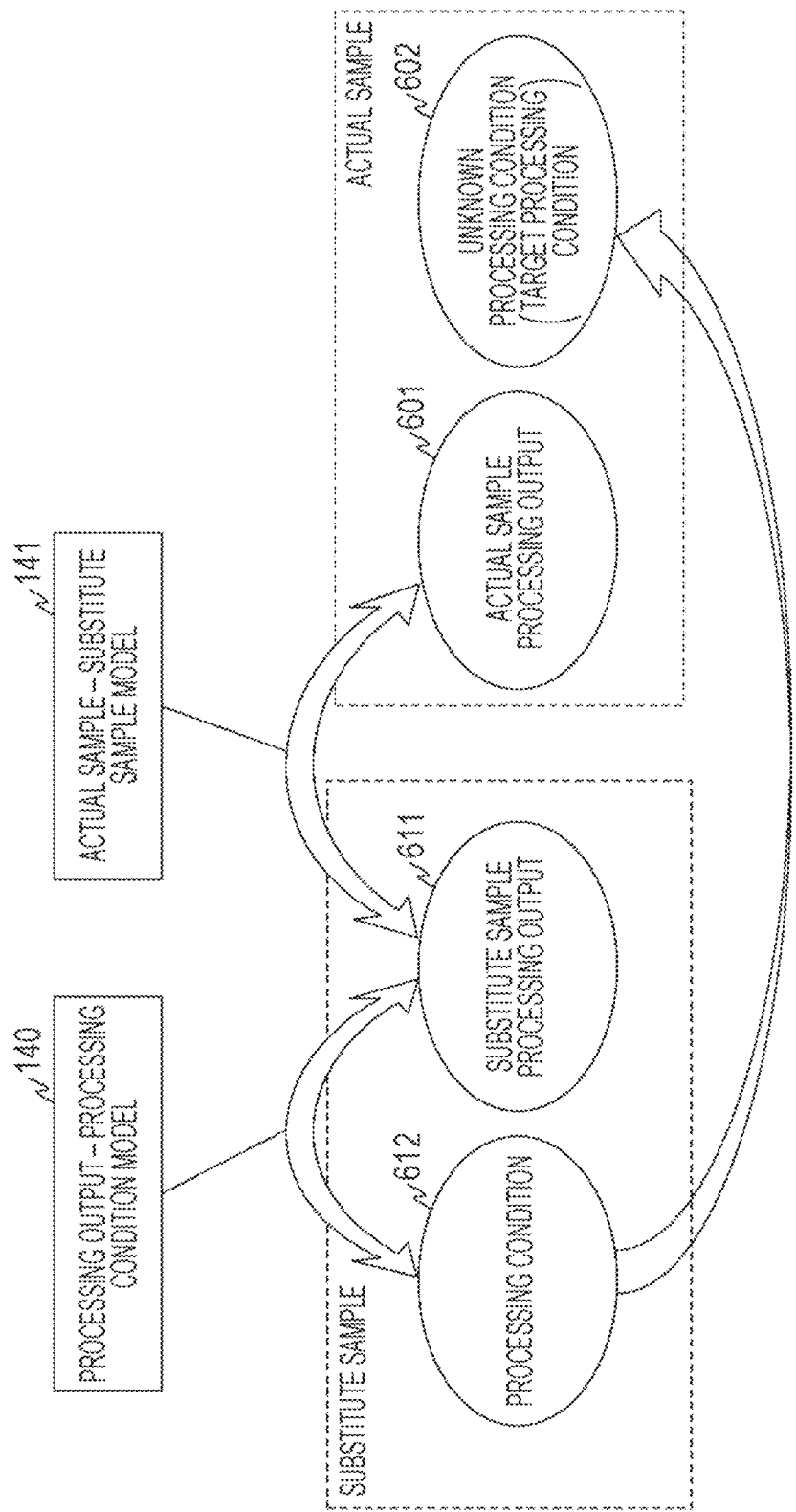

COMPUTER, METHOD FOR DETERMINING PROCESSING CONTROL PARAMETER, SUBSTITUTE SAMPLE, MEASUREMENT SYSTEM, AND MEASUREMENT METHOD

CLAIM OF PRIORITY

The present application claims priority from Japanese patent applications JP 2017-166813 filed on Aug. 31, 2017 and JP 2017-210346 filed on Oct. 31, 2017, the contents of which are hereby incorporated by reference into this application.

BACKGROUND OF THE INVENTION

1. Field of the Invention

The present invention relates to an apparatus and a method for determining a processing condition of a semiconductor process, a substitute sample of a semiconductor, a measurement system, and a measurement method.

2. Description of the Related Art

In a semiconductor process, a desired product can be manufactured by setting an appropriate processing condition (control parameters), obtained by process development, to a processing apparatus.

In recent years, as new materials constituting a device have been introduced and a device structure has become complicated, a device control range has been expanded and thus many new control parameters have been added.

It is essential to optimize a large number of control parameters so as to sufficiently derive performance of a processing apparatus. A technique for optimizing control parameters is disclosed in, for example, JP 2009-44125 A.

JP 2009-44125 A discloses that "a shape model of a structure defined by profile parameters characterizing a geometric shape of the structure is obtained. A set of values of profile parameters is obtained, and this is used to generate a set of simulation diffraction signals each characterizing the behavior of light diffracted from the structure. After a support vector machine is trained by using the set of simulation diffraction signals as an input and the set of values of profile parameters as an expected output, a manufacturing process is performed to manufacture a structure on a wafer. Measurement diffraction signals are obtained from the structure and are input to the trained support vector machine. As an output of the trained support vector machine, the values of the profile parameters of the structure are obtained. One or more process parameters or device settings of a manufacturing tool are adjusted based on the values of the profile parameters".

SUMMARY OF THE INVENTION

In recent years, a search technique for optimum processing conditions using machine learning has attracted attention. In the technique and machine learning disclosed in JP 2009-44125 A, a large amount of learning data is required. As a method of acquiring a large amount of learning data, a method set by an engineer having process development know-how and a high device operation skill or a method of performing a processing test many times can be considered.

However, there is a problem that engineers are insufficient. In addition, a sample used for a processing test is expensive because it is a sample used for actual product manufacture, and it takes much time to perform measurement for obtaining the result of the processing test. Therefore, in a method of optimizing a processing condition of processing using conventional learning data, it is difficult to reduce process development costs.

An aspect of the present invention provides an apparatus and a method for realizing optimization of processing conditions of processing with reduced process development costs.

A representative aspect of the present invention disclosed herein provides a computer for determining a control parameter of processing to be performed on a sample, and the computer includes: a memory unit configured to store a first model indicating a correlation between a first processing output obtained by measuring a first sample used for manufacturing, on which the processing is performed and a second processing output obtained by measuring a second sample that is easier to measure than the first sample and on which the processing is performed, and a second model indicating a correlation between a control parameter of the processing performed on the second sample and the second processing output; and an analysis unit configured to calculate a target control parameter of the processing performed on the first sample based on a target processing output as the target first processing output, the first model, and the second model.

According to an embodiment of the present invention, it is possible to reduce process development costs and calculate optimum control parameters. The problems, configurations, and effects other than those described above will become apparent from the following description of embodiments.

BRIEF DESCRIPTION OF THE DRAWINGS

FIG. 4 is a diagram illustrating an example of a GUI displayed on a substitute sample terminal according to the first embodiment;

FIG. 5 is a diagram illustrating an example of a GUI displayed on the substitute sample terminal according to the first embodiment;

FIG. 6 is a diagram for describing the concept of the processing of calculating the target processing condition according to the first embodiment;

DESCRIPTION OF THE PREFERRED EMBODIMENTS

Figure 1:
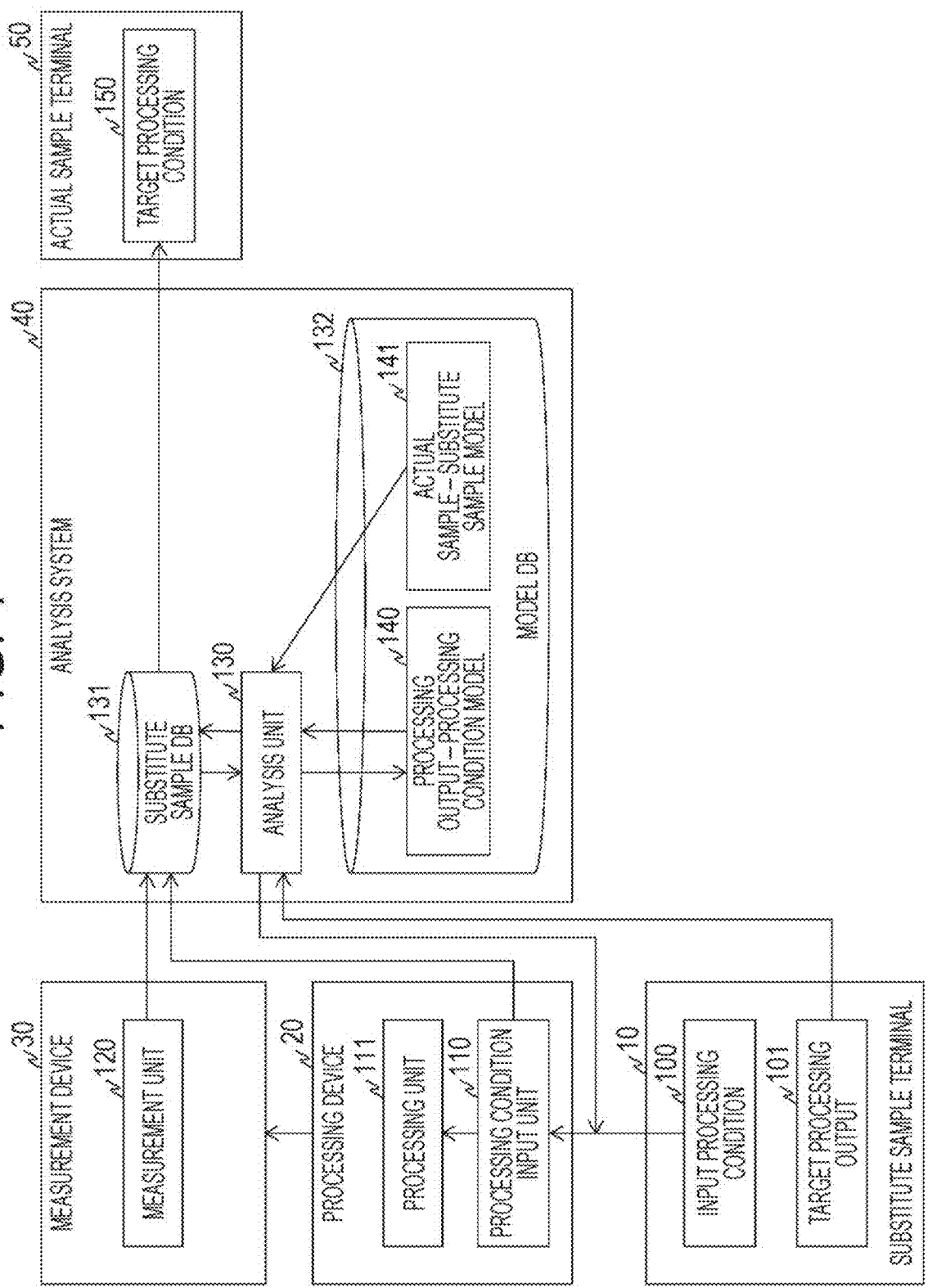
FIG. 1 is a block diagram illustrating an example of a configuration of a sample processing system according to a first embodiment.

Hereinafter, embodiments of the present invention will be described below with reference to the drawings. However, the present invention is not construed as being limited to the description of the embodiments provided below. It will be easily understood by those skilled in the art that specific configurations can be modified without departing from the spirit and scope of the present invention.

In the configurations of the invention described below, the same or similar configurations or functions are denoted by the same reference numerals, and redundant descriptions thereof will be omitted.

The terms "first", "second", "third", etc. may be used herein to identify components, and do not necessarily limit the number or order.

In order to facilitate the understanding of the invention, the positions, sizes, shapes, ranges, and the like of the respective components illustrated in the drawings or the like may not represent the actual positions, sizes, shapes, ranges, and the like. Therefore, the present invention is not limited to the positions, sizes, shapes, ranges, and the like illustrated in the drawings and the like.

First Embodiment

First, the terms used in this specification will be described.

The term "actual sample" refers to a sample used for manufacturing an actual product. The term "substitute sample" refers to a sample that is expected to have a correlation with an actual sample in a geometric structure, physical properties, and the like and enables easy measurement of states, characteristics, and the like. In the present embodiment, the actual sample is not used as the substitute sample. Examples of the substitute sample include a structure on a wafer, such as a test element group (TEG) sample and a sample with a hut. In this specification, in a case where the "actual sample" and the "substitute sample" are not discriminated from each other, they are referred to as "samples".

The term "processing" refers to processing, such as film-forming processing, lithography processing, and etching processing, which is performed on an actual sample and a substitute sample. The term "processing condition" refers to information for controlling an apparatus that performs the above-described processing. Specifically, the processing condition is information including, as an element, a control parameter to be set to the processing apparatus. The term "processing output" refers to information indicating a shape, properties, and the like of a sample, which are obtained by measuring the sample during or after processing. Specifically, the processing output is information including, as an element, a measurement value measured by a measurement device.

So far, the terms used in this specification have been described. Next, a specific configuration of a sample processing system will be described.

Figure 2:
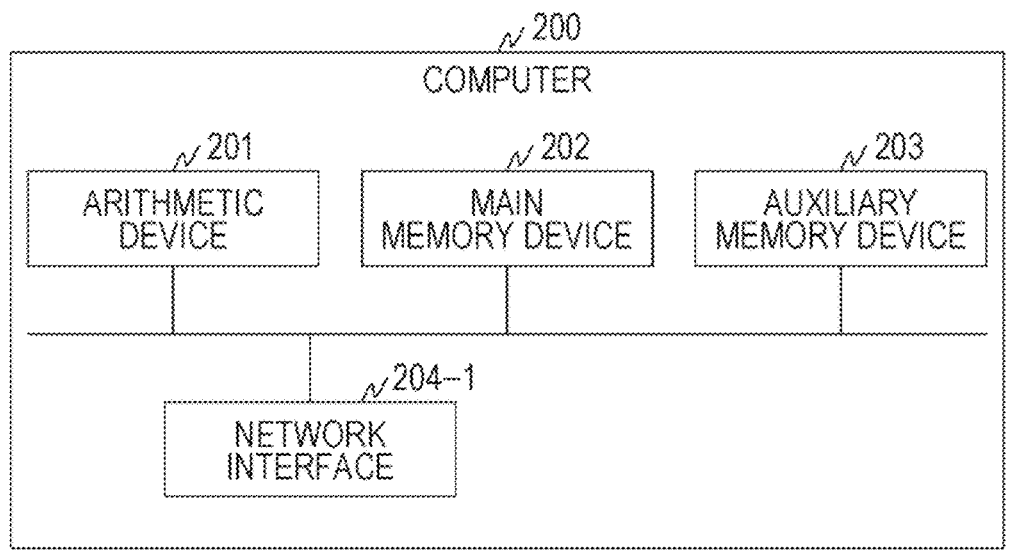
FIG. 2 is a block diagram illustrating an example of a hardware configuration of a computer constituting the sample processing system according to the first embodiment.

FIG. 1 is a block diagram illustrating an example of a configuration of a sample processing system according to a first embodiment. FIG. 2 is a block diagram illustrating an example of a hardware configuration of a computer constituting the sample processing system according to the first embodiment.

The sample processing system includes a substitute sample terminal 10, a processing device 20, a measurement device 30, an analysis system 40, and an actual sample terminal 50. It should be noted that the substitute sample terminal 10 and the actual sample terminal 50 may be integrated into one terminal. The respective components included in the sample processing system are connected to each other directly or via a network.

The substitute sample terminal 10 is a device configured to input a processing condition of processing to be performed on a substitute sample. The substitute sample terminal 10 generates an input processing condition 100 based on a user's input and inputs the generated input processing condition 100 to the processing device 20. As described below, the user operates the substitute sample terminal 10 to input the input processing condition 100 and a target processing output 101. The input processing condition 100 is an input for generating a substitute sample DB 131 and is a processing condition of processing of the substitute sample. The target processing output 101 is an input for calculating a target processing condition 150 and is a target value of a processing output of an actual sample. It should be noted that the target processing output 101 can include a condition satisfied by an element included in the processing output of the actual sample.

The processing device 20 is a device that performs processing on a sample based on the processing condition, and includes a processing condition input unit 110 and a processing unit 111. The processing device 20 performs, for example, semiconductor etching processing. It should be noted that the present embodiment is not limited to a type of the processing performed by the processing device 20 and the contents of the processing.

The processing device 20 is, for example, a lithography device, a film-forming device, a pattern processing device, an ion implantation device, a heating device, or a cleaning device.

Examples of the lithography device include an exposure device, an electron beam lithography device, and an X-ray lithography device. Examples of the film-forming device include a CVD, a PVD, a deposition device, a sputtering device, and a thermal oxidation device. Examples of the pattern processing device include a wet etching device, a dry etching device, an electron beam processing device, and a laser processing device. Examples of the ion implantation device include a plasma doping device and an ion beam doping device. Examples of the heating device include a resistance heating device, a lamp heating device, and a laser heating device. Examples of the cleaning device include a liquid cleaning device and an ultrasonic cleaning device.

The processing condition input unit 110 receives a processing condition input from the substitute sample terminal 10 or the actual sample terminal 50, and outputs the received processing condition to the processing unit 111. When the processing condition input unit 110 receives the input processing condition 100 from the substitute sample terminal 10, the processing condition input unit 110 transmits the input processing condition 100 to the analysis system 40.

The processing unit 111 controls the processing performed on the sample based on the processing condition. For example, the processing unit 111 controls the processing performed on the substitute sample based on the input processing condition 100.

The measurement device 30 is a device that measures values indicating a shape and properties of a sample to be processed by the processing device 20, and includes a measurement unit 120. The measurement unit 120 controls the measurement of the values.

For example, the measurement device 30 acquire values indicating a shape and properties of a sample by measuring reflection, transmission, interference, absorption, and polarization spectrum of light, laser, X-ray, and the like, which are incident on the sample. More specifically, the measurement device 30 is a device using an electron microscope, an optical monitor, a temperature measurement device using infrared light, a defect detection device using a Kelvin probe force microscope, a prober device for evaluating electric characteristics, and the like.

The measurement device 30 may measure not only a measurement value related to the processed sample but also a medium such as plasma, gas, and liquid acting on the sample during processing and a product generated during processing. The medium and the product do not directly represent the state of the sample, but the medium and the product are physical quantities that can indicate a correlation between a processing state and a processing result, and thus the medium and the product are useful information as information on the sample.

For example, the measurement device 30 may be a plasma emission monitor using optical spectrum measurement, a deposit monitor in a processing chamber using infrared spectroscopy, a monitor for monitoring an atom and a molecule released from a processing target by using a mass spectrometer, and a monitor for monitoring electric characteristics in a processing chamber by using a probe.

In addition, the measurement device 30 may be a sensor configured to acquire power output values such as voltage, current, and power, values of variable electric elements such as capacitors and coils in a matching device, flow rates of various gases used, temperatures of device frames and device components, pressure in the processing chamber, an opening degree of a pressure control valve, a valve opening/closing state, a gas discharge speed, and an operation timing and an operation time of processing and a device.

In FIG. 1, the measurement device 30 and the processing device 20 are described as separate components, but the measurement device 30 may be incorporated in the processing device 20. In addition, the sample processing system may include a plurality of measurement devices 30 that measure the same or different values.

The analysis system 40 analyzes a correlation between the processing condition of the substitute sample and the processing output, and calculates the target processing condition 150 that is the processing condition of the processing to be performed on the actual sample, based on the target processing output 101. The analysis system 40 includes an analysis unit 130, the substitute sample DB 131, and a model DB 132.

The analysis unit 130 performs learning processing such as machine learning and statistical analysis so as to analyze a correlation between the processing condition of the processing to be performed on the substitute sample and the processing output of the substitute sample. The machine learning is, for example, processing using a regression analysis such as kernel regression, a neural network, and the like. The statistical analysis is, for example, processing using a correlation analysis, a principal component analysis, and the like.

The analysis unit 130 calculates the target processing condition 150 based on the model DB 132 and the target processing output 101. Details of the processing performed by the analysis unit 130 will be described below. In addition, the analysis unit 130 manages the substitute sample DB 131 and the model DB 132.

It should be noted that the function of managing the database may be separated from the analysis unit 130 and set as a memory unit. In addition, a device that is separate from the analysis system 40 may hold the substitute sample DB 131 and the model DB 132.

The substitute sample DB 131 is a database that manages the processing condition of the processing to be performed on the substitute sample and the processing output of the substitute sample in association with each other. The substitute sample DB 131 includes, for example, an entry including a field for storing identification information of the substitute sample, a field for storing the type of the substitute sample, a field for storing the processing condition, and a field for storing the processing output.

The model DB 132 is a database that manages models that are definition information of a correlation of arbitrary values. The model DB 132 includes a processing output-processing condition model 140 and an actual sample-substitute sample model 141.

The processing output-processing condition model 140 is a model that defines a correlation between the processing condition of the processing to be performed on the substitute sample and the processing output of the substitute sample. As described below, the processing output-processing condition model 140 is generated by the learning processing performed by the analysis unit 130.

The actual sample-substitute sample model 141 is a model that defines a correlation between the processing output of the substitute sample and the processing output of the actual sample. It is assumed that the actual sample-substitute sample model 141 is generated in advance.

It should be noted that a method of generating the actual sample-substitute sample model 141 is not limited. For example, the actual sample-substitute sample model 141 may be generated based on a geometric optical simulation, a wave optical simulation using Maxwell's equation, a fluid simulation using Navier-Stokes equation, a molecular dynamics simulation, and the like, and may be generated based on machine learning and statistical analysis.

It should be noted that the actual sample-substitute sample model 141 may not be a model that is established in an entire region of a space with an element included in the processing output as an axis. For example, the actual sample-substitute sample model 141 may be a model that is established only in a region around a predicted value of the processing output of the actual sample.

It is to be noted that the actual sample-substitute sample model 141 may be generated by the analysis system 40, or may be generated by an external system. When the actual sample-substitute sample model 141 is generated by the analysis system 40, the analysis unit 130 can generate the actual sample-substitute sample model 141 by performing learning processing using the processing output of the actual sample and the processing output of the substitute sample, which are acquired under the same processing condition.

The actual sample terminal 50 is a device configured to input a processing condition of processing to be performed on an actual sample. The actual sample terminal 50 inputs, to the processing device 20, the target processing condition 150 input from the analysis system 40.

It should be noted that the substitute sample terminal 10, the actual sample terminal 50, and the analysis system 40 are implemented by using a computer 200 as illustrated in FIG. 2. The computer 200 includes an arithmetic device 201, a main memory device 202, an auxiliary memory device 203, and a network interface 204.

The arithmetic device 201 executes a program stored in the main memory device 202. The arithmetic device 201 is, for example, a processor, a graphics processing unit (GPU), or a field programmable gate array (FPGA). The arithmetic device 201 operates as a module that implements a specific function by performing processing according to the program.

The main memory device 202 stores the programs executed by the arithmetic device 201 and information used by the program. In addition, the main memory device 202 includes a work area that is temporarily used by the program. The main memory device 202 is, for example, a volatile or non-volatile memory. The main memory device 202 stores, for example, a program that implements the analysis unit 130.

The auxiliary memory device 203 is a device that permanently stores data. The auxiliary memory device 203 is, for example, a hard disk drive (HDD) or a solid state drive (SSD). The auxiliary memory device 203 stores, for example, the substitute sample DB 131 and the model DB 132. It should be noted that the auxiliary memory device 203 may store the program that implements the analysis unit 130 and the like. In this case, the arithmetic device 201 reads the program from the auxiliary memory device 203 and loads the read program into the main memory device 202.

The network interface 204 is an interface configured to connect to another device via a network.

It should be noted that the computer 200 may include an input device such as a keyboard, a mouse, and a touch panel, and an output device such as a display.

Figure 3:
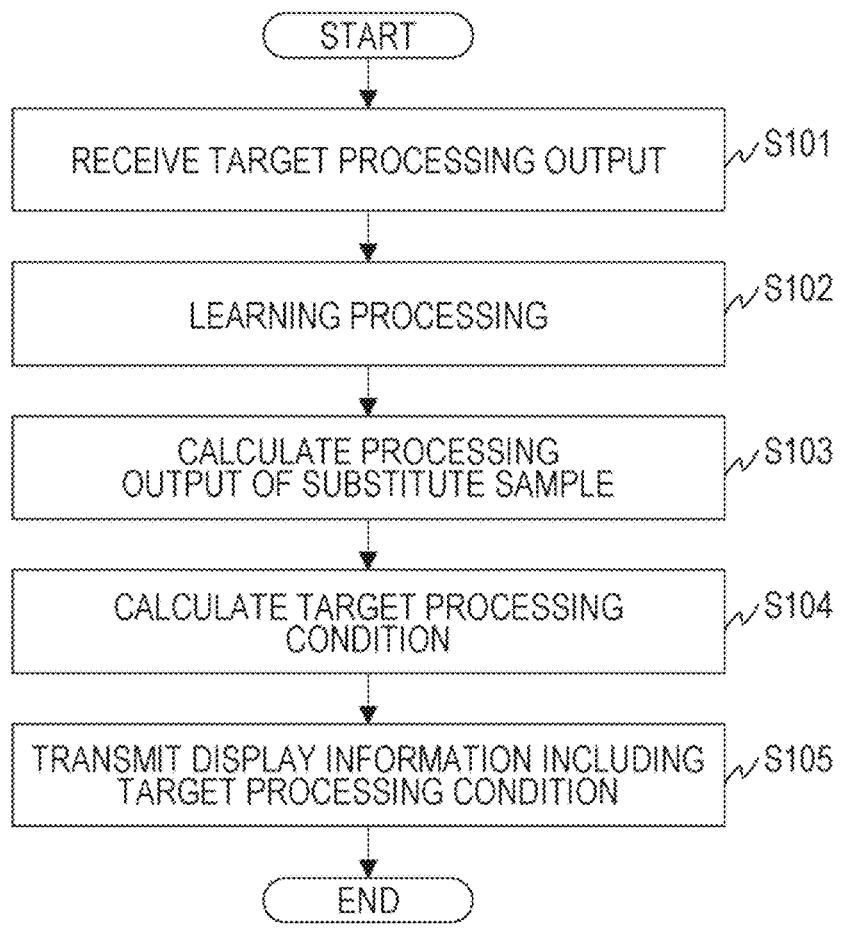
FIG. 3 is a flowchart for describing processing of calculating a target processing condition, which is performed by an analysis system according to the first embodiment.

FIG. 3 is a flowchart for describing processing of calculating the target processing condition 150 executed by the analysis system 40 according to the first embodiment. FIGS. 4 and 5 are diagrams illustrating an example of a GUI displayed on the substitute sample terminal 10 according to the first embodiment.

The user instructs the execution of the learning processing and the processing of calculating the target processing condition 150 by using a GUI 400 displayed on the substitute sample terminal 10. Here, the GUI 400 will be described.

The GUI 400 includes a learning processing column 410, a target processing output column 420, a model column 430, and a determination button 440. In addition, a lamp 450 indicating whether the input to the column is valid is included in each of the learning processing column 410, the target processing output column 420, and the model column 430. When the input to the column is valid, the lamp 450 is turned on. Therefore, the user can confirm that a correct value has been input. In addition to the lamp 450, a pop-up display and a sound reproduction may be performed.

The learning processing column 410 is a column for setting the learning processing that generates the processing output-processing condition model 140, and includes a learning processing type column 411. The learning processing column 410 may include a column for registering or designating the substitute sample DB 131 to be used for the learning processing.

The learning processing type column 411 is a column for selecting a specific calculation method of the learning processing using the substitute sample DB 131. In the learning processing type column 411 of the present embodiment, a check box for selecting a calculation method is displayed.

The target processing output column 420 is a column for setting the target processing output 101 and includes a target numerical value column 421. It should be noted that the target processing output column 420 may include a column for setting a condition satisfied by an element included in the target processing output 101.

The target numerical value column 421 is a column for inputting a numerical value to be set as the target processing output 101. In the present embodiment, a numerical value of each element included in the processing output is set.

The model column 430 is a column for setting the actual sample-substitute sample model 141 and includes a manual input column 431 and an automatic input column 432.

The manual input column 431 is a column for inputting a correlation between the processing output of the actual sample and the processing output of the substitute sample, which is defined as the actual sample-substitute sample model 141. In the manual input column 431 of the present embodiment, a check box for selecting a correlation model is displayed. By specifying an arbitrary correlation model, it is possible to define the correlation between the processing output of the actual sample and the processing output of the substitute sample. In the present embodiment, the correlation can be defined in units of elements included in the processing output.

The automatic input column 432 is a column for setting the learning processing that generates the actual sample-substitute sample model 141. The automatic input column 432 includes a column for inputting a database of the processing output of the actual sample, a column for inputting the database of the processing output of the substitute sample, and a column for inputting a calculation method of the learning processing. It should be noted that the processing condition acquired under the same processing condition is stored in the two databases designated by using the automatic input column 432.

The determination button 440 is an operation button for transmitting a value, which is input to one of the learning processing column 410, the target processing output column 420, and the model column 430, to the analysis system 40.

When the user inputs a value to the learning processing column 410 and operates the determination button 440, the substitute sample terminal 10 transmits, to the processing device 20, the value set in the learning processing column 410. In this case, the analysis unit 130 sets the designated calculation method of the learning processing.

When the user inputs a value to the target processing output column 420 and operates the determination button 440, the substitute sample terminal 10 transmits, to the processing device 20, the target processing output 101 including the value set in the target processing output column 420.

When the user inputs a value to the model column 430 and operates the determination button 440, the substitute sample terminal 10 transmits, to the analysis system 40, a model generation request including the value set in the model column 430. In this case, the analysis unit 130 generates the actual sample-substitute sample model 141, or updates the actual sample-substitute sample model 141.

So far, the GUI 400 has been described. The following returns to the description of FIG. 3.

The analysis unit 130 receives the target processing output 101 from the substitute sample terminal 10 (step S101).

The analysis unit 130 executes learning processing by using the substitute sample DB 131 (step S102). The analysis unit 130 stores the result of the learning processing in the model DB 132 as the processing output-processing condition model 140.

It should be noted that the analysis unit 130 may read all the data registered in the substitute sample DB 131, or may select an entry to be read based on the designated type of the substitute sample.

It should be noted that, when the processing output-processing condition model 140 has already been generated, the analysis unit 130 can omit the processing of step S102.

Subsequently, the analysis unit 130 calculates the processing output of the substitute sample corresponding to the target processing output 101 by using the target processing output 101 and the actual sample-substitute sample model 141 (step S103).

For example, when the actual sample-substitute sample model 141 is given as a quantitative correlation, that is, a function, the analysis unit 130 calculates the processing output of the substitute sample by substituting the target processing output 101 into the function.

It should be noted that a plurality of processing outputs of the substitute sample may be calculated. For example, when a model designating a range is set for an arbitrary element of the processing output, a plurality of processing outputs including the element included in the range is calculated.

The correlation between the processing output of the actual sample and the processing output of the substitute sample may be not a quantitative correlation but a qualitative correlation. For example, a case where a qualitative correlation such as "an element A is also larger as an element B is larger" is present between the element A of the processing output of the substitute sample and the element B of the processing output of the actual sample is considered. When a maximum possible value B' of the element B is input as the target processing output 101, the analysis unit 130 calculates a maximum possible value A' of the element A as the processing output of the substitute sample.

Subsequently, the analysis unit 130 calculates the target processing condition 150 by using the processing output of the substitute sample and the processing output-processing condition model 140 (step S104).

Specifically, the analysis unit 130 calculates the processing condition (estimated processing condition) of the substitute sample, which can obtain the processing output of the substitute sample, by using the processing output-processing condition model 140.

For example, when the processing output-processing condition model 140 is given as a function, the analysis unit 130 calculates the estimated processing condition by substituting the processing output of the substitute sample into the function. Since the substitute sample and the actual sample are processed by using the same processing device 20, the estimated processing condition is the target processing condition 150.

It noted that the analysis unit 130 may transmit the target processing condition 150 to the substitute sample terminal 10 as the input processing condition 100. By repeating similar calculation processing, an optimum processing condition can be calculated and a new processing condition can be discovered.

It should be noted that the analysis unit 130 may not use the processing output-processing condition model 140. For example, the analysis unit 130 refers to the substitute sample DB 131 and searches for an entry that matches or is similar to the calculated processing output of the substitute sample. The analysis unit 130 calculates the processing condition of the substitute sample included in the found entry as the target processing condition 150.

Subsequently, the analysis unit 130 generates display information including the target processing condition 150, and transmits the generated display information to the actual sample terminal 50 (step S105). It should be noted that the analysis unit 130 may store the target processing condition 150 in the auxiliary memory device 203 and may read the target processing condition 150 to generate the display information when a display request is received from the actual sample terminal 50.

When the actual sample terminal 50 receives the display information, the actual sample terminal 50 displays a GUI 500 as illustrated in FIG. 5. Here, the GUI 500 will be described.

The GUI 500 includes a result display column 510 and a determination button 520.

The result display column 510 is a column for displaying the result of the calculation processing of the target processing condition 150. The result display column 510 includes one or more entries including a field for storing the target processing output 101 and a field for storing the target processing condition 150. The entry includes a radio button. The target processing output 101 may be displayed as an image, or may be displayed as a numerical value.

The determination button 520 is an operation button for inputting the target processing condition 150 to the processing device 20. When the user operates the radio button of the entry included in the result display column 510 and further operates the determination button 520, the target processing condition 150 of the entry of which the radio button has been operated is input to the processing device 20. When the target processing condition 150 is received, the processing device 20 performs processing on the actual sample based on the target processing condition 150.

Here, the calculation processing performed by the analysis system 40 will be described. FIG. 6 is a diagram for describing the concept of the processing of calculating the target processing condition 150 according to the first embodiment. Here, for simplicity of description, it is assumed that the processing output-processing condition model 140 and the actual sample-substitute sample model 141 are given as functions.

Ellipses in FIG. 6 represent an actual sample processing output space 601, an actual sample processing condition space 602, a substitute sample processing output space 611, and a substitute sample processing condition space 612, respectively.

The actual sample processing output space 601 and the substitute sample processing output space 611 represent spaces with the elements included in the processing output as axes. It should be noted that the dimensions of the actual sample processing output space 601 and the substitute sample processing output space 611 do not necessarily coincide with each other. The dimension of the substitute sample processing output space 611 may be lower than the dimension of the actual sample processing output space 601.

The actual sample processing condition space 602 and the substitute sample processing condition space 612 represent spaces with the elements included in the processing condition as axes. The actual sample processing condition space 602 and the substitute sample processing condition space 612 are spaces of the same dimension, and the two spaces can be regarded as being the same as each other.

The analysis system 40 holds the actual sample-substitute sample model 141 indicating a mapping relationship (correlation) between the actual sample processing output space 601 and the substitute sample processing output space 611.

In step S103, the analysis system 40 generates the processing output-processing condition model 140 indicating a mapping relationship (correlation) between the substitute sample processing output space 611 and the substitute sample processing condition space 612.

In step S104, the analysis system 40 receives an arbitrary source of the actual sample processing output space 601 as an input.

In step S105, the analysis system 40 maps the source of the actual sample processing output space 601 to the substitute sample processing condition space 612 by using the actual sample-substitute sample model 141. The source of the substitute sample processing condition space 612 is the processing output of the substitute sample.

The analysis system 40 maps the source of the substitute sample processing condition space 612 to the substitute sample processing condition space 612 by using the processing output-processing condition model 140. Since the actual sample processing condition space 602 can be regarded as being the same as the substitute sample processing condition space 612, the source of the substitute sample processing condition space 612 can be regarded as the source of the actual sample processing condition space 602. Therefore, the analysis system 40 outputs the source as the target processing condition 150.

Next, specific examples of the actual sample, the substitute sample, and the actual sample-substitute sample model 141 will be described. Here, a sample to be subjected to plasma etching processing will be described as an example.

Figure 7A:
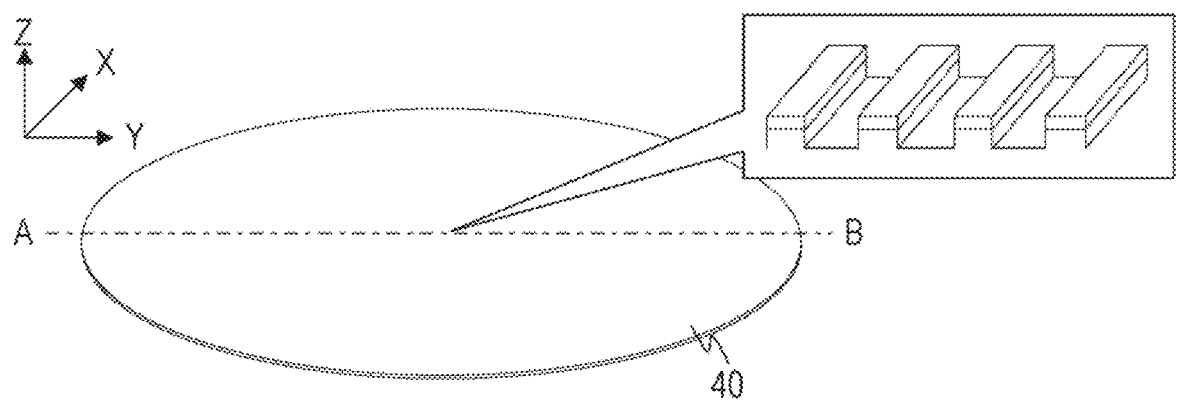
FIG. 7A is a diagram illustrating an example of an actual sample according to the first embodiment.
Figure 7B:
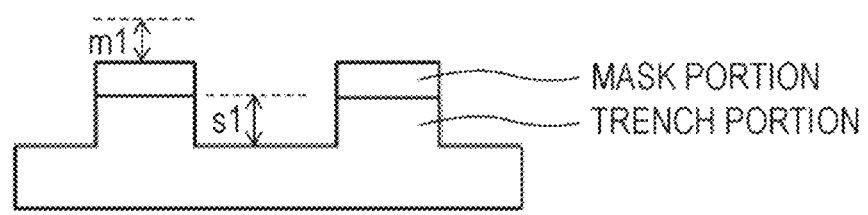
FIG. 7B is a diagram illustrating an example of an actual sample according to the first embodiment.
Figure 8A:
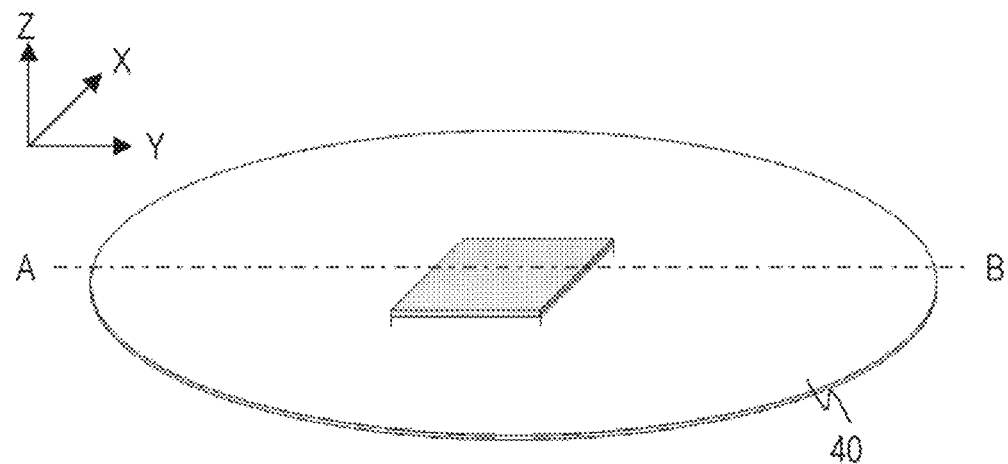
FIG. 8A is a diagram illustrating an example of a substitute sample according to the first embodiment.
Figure 8B:
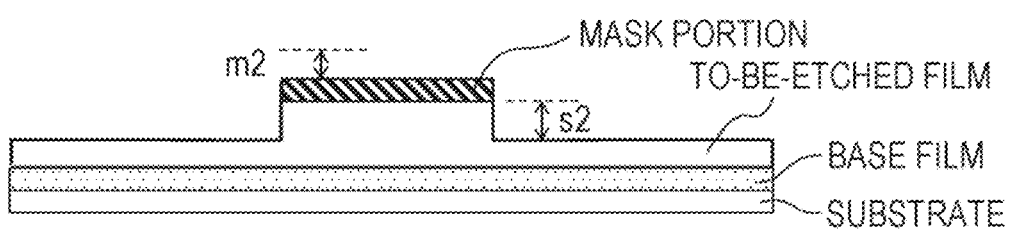
FIG. 8B is a diagram illustrating an example of a substitute sample according to the first embodiment.

First, a case where a quantitative correlation can be defined between all elements included in the processing output of the actual sample and all elements included in the processing output of the substitute sample will be described. FIGS. 7A and 7B are diagrams illustrating an example of an actual sample according to the first embodiment. FIGS. 8A and 8B are diagrams illustrating an example of a substitute sample according to the first embodiment.

FIG. 7A illustrates a masked pattern of an actual sample to be subjected to etching processing for forming a trench structure. FIG. 7B is a cross-sectional view illustrating a cross section (YZ plane) of the actual sample, taken along a dashed line AB, when viewed in a positive direction of an X axis.

FIG. 8A illustrates a wafer in which a portion thereof is filmed with the same material as that of a mask portion of the actual sample illustrated in FIG. 7 and the other portion is filmed with the same material as that of a trench portion. FIG. 8B is a cross-sectional view illustrating a cross section (YZ plane) of the substitute sample, taken along a dashed line AB, when viewed in a positive direction of an X axis. It should be noted that it is possible to use, as the substitute sample, a sample in which a chip of the same material as that of the mask portion of the actual sample or a chip obtained by cutting a wafer on which the same material as that of the mask portion of the actual sample is filmed is fixed on a wafer serving as a substrate.

The dashed lines above the mask portion and the trench portion illustrated in FIG. 7B indicate the positions of the mask portion and the trench portion before processing. In addition, the dashed lines above the mask portion and the to-be-etched film illustrated in FIG. 8B indicate the positions of the mask portion and the to-be-etched film before processing.

Physical quantities characterizing the shape of the actual sample include an etching rate of the mask portion and an etching rate of the trench portion. In addition, physical quantities characterizing the shape of the substrate sample include an etching rate of the mask portion and an etching rate of the trench portion.

In the following description, the etching rate of the mask portion and the etching rate of the trench portion in the actual sample are defined as m1 and s1, respectively, and the etching rate of the mask portion and the etching rate of the trench portion in the substitute sample are defined as m2 and s2, respectively. In addition, it is assumed that m1 and s1 are included in the processing output of the actual sample, and m2 and s2 are included in the processing output of the substitute sample.

A method of calculating the target processing condition 150 for adjusting m1 and s1 to the target processing output 101 in plasma etching processing will be described. It is assumed that a condition expressed in Formula (1) is set as a condition satisfied by m1 and s1.

[Math. 1]

$$\frac{s_1}{m_1} \gg 1 \tag{1}$$

When the actual sample is a fine pattern as illustrated in FIG. 7A, it is difficult to confirm diffracted light and measure an effective complex refractive index, and thus it is also difficult to measure m1 and s1 by using an optical measurement device. Therefore, it is necessary to measure cross-section information of the actual sample. In order to measure the cross-section information of the actual sample, it is necessary to take out the actual sample from the processing device 20 and further perform processing for measuring the cross-section information. Therefore, it takes much time to acquire learning data and it becomes expensive.

On the other hand, it is possible to measure m2 and s2 in the substitute sample by using interference of light because the base film is present under the wafer and the to-be-etched film of the chip as illustrated in FIG. 8B. In the case of using a film thickness measurement device built in the processing device 20, it is unnecessary to take out the substitute sample from the processing device 20 and process the substitute sample so as to measure a pressure film. Therefore, it is possible to acquire learning data at a high speed and at a low cost, as compared with the case of acquiring learning data from the actual sample.

It should be noted that, even when the measurement device 30 is not built in the processing device 20, standalone optical measurement is possible, and thus the processing of the substitute sample is unnecessary.

The actual sample-substitute sample model 141 of the actual sample illustrated in FIG. 7A and the substitute sample illustrated in FIG. 8A can be considered as follows.

Since the actual sample and the substitute sample are made of the same material, when the processing condition is the same, the mathematical expressions shown in Formulae (2) and (3) can be defined as the actual sample-substitute sample model 141.

[Math. 2]

$$m1 \approx m2 \tag{2}$$

[Math. 3]

$$s1 \approx s2 \tag{3}$$

Here, when m1=1 nm/min and s1=100 nm/min are input to the analysis system 40 as the target processing output 101 that satisfies Formula (1), the analysis system 40 calculates, for example, m2=1 nm/min and s2=100 nm/min as the processing output of the substitute sample from the actual sample-substitute sample model 141 as shown in Formulae (2) and (3).

Although the substitute sample using the chip of the same material as that of the mask portion has been described as an example, the present invention is not limited thereto. For example, a material exhibiting processing characteristics similar to those of the mask portion, or a material having a correlation with the processed shape of the mask portion can also be applied.

In the case of a substitute sample to which the material exhibiting processing characteristics similar to those of the mask portion is applied, the actual sample-substitute sample model 141 as shown in Formulae (2) and (3) can be used. In addition, when the material has a correlation with the processed shape of the mask portion and the correlation is known, the correlation can be used as the actual sample-substitute sample model 141. When the above-described correlation is not known, the actual sample-substitute sample model 141 obtained from the learning processing using experimental data can be set.

Figure 9A:
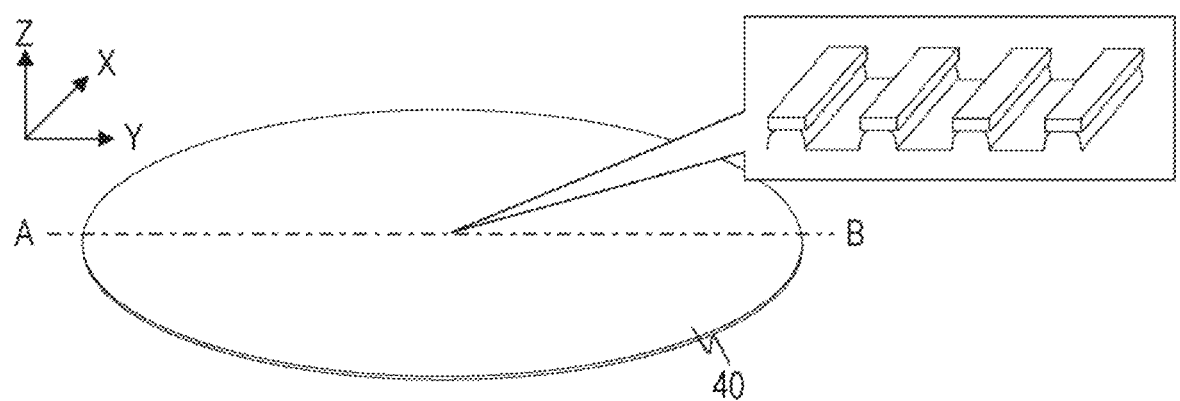
FIG. 9A is a diagram illustrating an example of an actual sample according to the first embodiment.
Figure 9B:
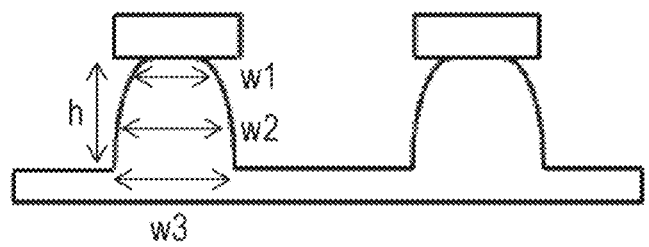
FIG. 9B is a diagram illustrating an example of an actual sample according to the first embodiment.
Figure 10A:
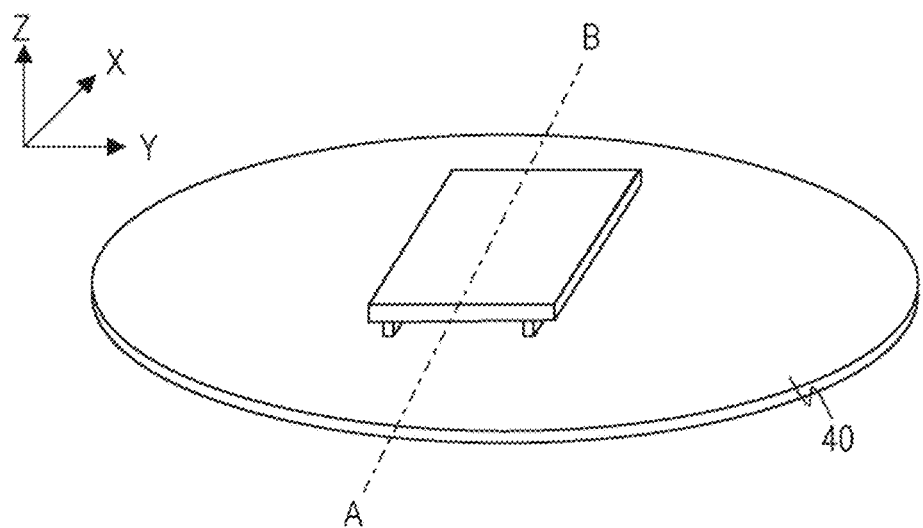
FIG. 10A is a diagram illustrating an example of a substitute sample according to the first embodiment.
Figure 10B:
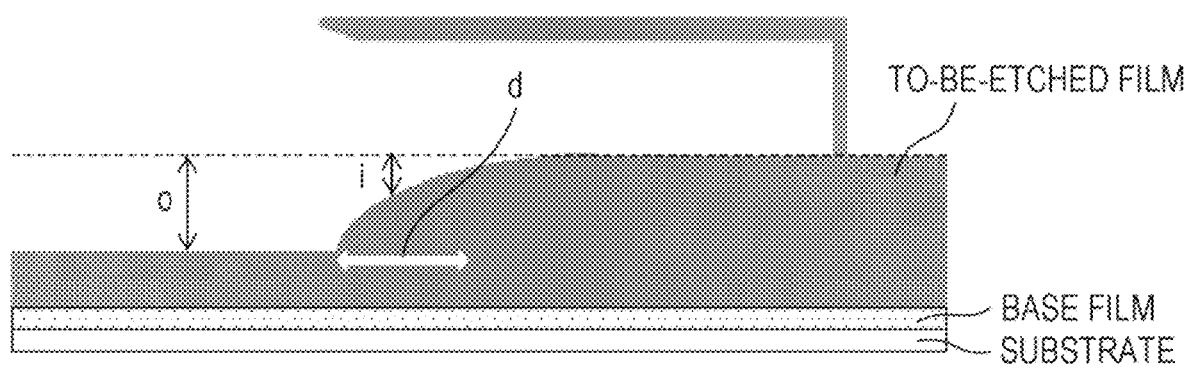
FIG. 10B is a diagram illustrating an example of a substitute sample according to the first embodiment.
Figure 11:
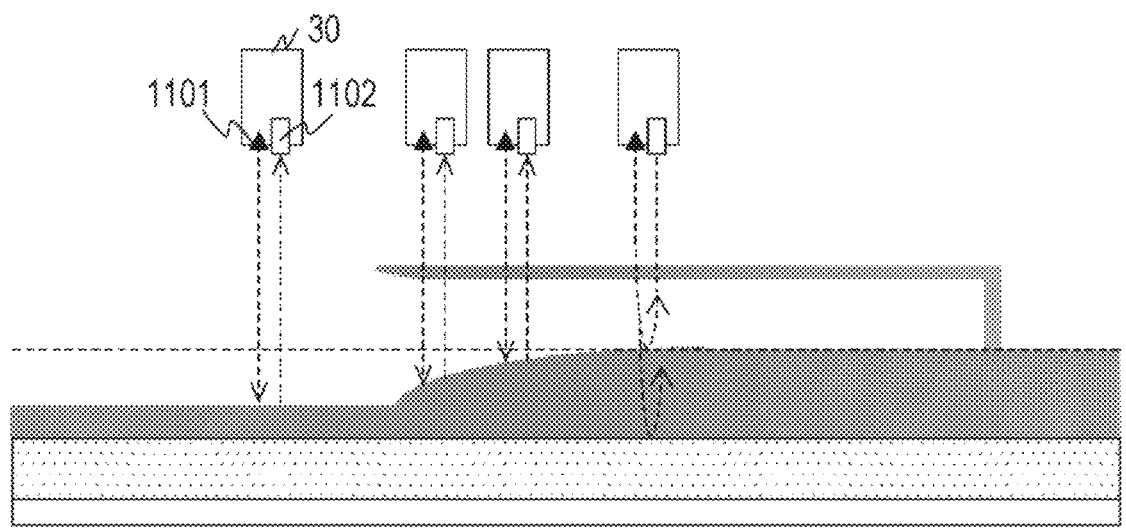
FIG. 11 is a diagram illustrating an example of a method of measuring physical quantities of a substitute sample according to the first embodiment.

First, a case where a quantitative correlation can be defined between a part of elements included in the processing output of the actual sample and a part of elements included in the processing output of the substitute sample will be described. FIGS. 9A and 9B are diagrams illustrating an example of an actual sample according to the first embodiment. FIGS. 10A and 10B are diagrams illustrating an example of a substitute sample according to the first embodiment. FIG. 11 is a diagram illustrating an example of a method of measuring physical quantities of a substitute sample according to the first embodiment.

FIG. 9A illustrates a masked pattern of an actual sample to be subjected to etching processing for forming a trench structure. FIG. 9B is a cross-sectional view illustrating a cross section (YZ plane) of the actual sample, taken along a dashed line AB, when viewed in a positive direction of an X axis.

FIG. 10A illustrates a substitute sample (sample with a hut) on which a roof is provided on a wafer. It is assumed that the upper portion of the roof is made of a transparent material that transmits light. It is assumed that a to-be-etched film of the substitute sample is the same material as that of a trench portion of the actual sample. FIG. 10B is a cross-sectional view illustrating a cross section (XZ plane) of the substitute sample, taken along a dashed line AB, when viewed in a negative direction of a Y axis. The substitute sample has a void structure as illustrated in FIG. 10B. In addition, a dashed line illustrated in FIG. 10B indicates a position of the to-be-etched film before processing.

The physical quantities characterizing the shape of the actual sample include a width of a vertex part of a trench portion, a width of a central part of the trench portion, a width of a bottom part of the trench portion, and a depth of the actual sample. The physical quantities characterizing the shape of the substitute sample include an etching amount outside the hut, an etching amount inside the hut, and an attenuation length inside the hut.

In the following description, the width of the vertex part of the trench portion, the width of the central part of the trench portion, and the width of the bottom part of the trench portion in the actual sample, and the depth of the actual sample are defined as w1, w2, w3, and h, respectively. In addition, the etching amount outside the hut, the etching amount inside the hut, and the attenuation length of the etching amount inside the hut in the substitute sample are defined as o, i, and d, respectively. In addition, it is assumed that w1, w2, w3, and h are included in the processing output of the actual sample, and o, i, and d are included in the processing output of the substitute sample.

A method of calculating the target processing condition 150 for adjusting w1, w2, w3, and h to the target processing output 101 in plasma etching processing will be described. It is assumed that the condition that w1, w2, and w3 are substantially equal to one another and h is the maximum is set as the condition that w1, w2, w3, and h satisfy.

Similarly to the actual sample illustrated in FIG. 7A, it is difficult to measure w1, w2, w3, and h of the actual sample illustrated in FIG. 9A by using an optical measurement device, and it takes much time and is expensive to acquire learning data.

Meanwhile, as illustrated in FIG. 11, since the hut of the substitute sample is transparent, the physical quantities representing the shape can be measured from an arbitrary measurement position by film thickness measurement or the like using interference of light. Specifically, the measurement device 30 emits light from a light source 1101 and detects reflected light from a to-be-etched film and a base film by using a detector 1102. In this manner, the processing output can be acquired without taking out the substitute sample from the processing device 20 and processing the substitute sample. Therefore, it is possible to acquire learning data at a high speed and at a low cost, as compared with the case of acquiring learning data from the actual sample.

It is desirable to perform the measurement of o, and d in the vicinity of the central part of a hut opening parallel to the Y axis of the substitute sample. However, when the distribution of the etching amount in an X-axis direction at a portion sufficiently far from both ends of the hut to the inside is uniform, o, i, and d may be measured at an arbitrary position.

The actual sample-substitute sample model 141 of the actual sample illustrated in FIG. 9A and the substitute sample illustrated in FIG. 10A can be considered as follows.

When d is large, an etching rate inside the hut is difficult to attenuate. Thus, as d increases, the etching rate approaches a uniform etching amount inside the hut. On the other hand, when d is small, the etching rate inside the hut attenuates immediately, and thus the etching amount further increases in the vicinity of the opening portion of the hut than in the other portions.

As illustrated in FIGS. 9B and 10B, the actual sample and the substitute sample have similar groove structures. Therefore, the properties of the substitute sample have the following relationship with the properties of the actual sample. When i of the actual sample is large, it is considered that the etching rate in a horizontal direction of the actual sample also increases, and thus it is expected that a difference between w1, w2, and w3 will tend to increase. When d of the substitute sample is small, an etching reaction proceeds only to the to-be-etched film just under the mask portion, and thus it is expected that w1 will tend to increase more than w2 and w3. Therefore, the above-described properties between w1, w2, and w3 of the actual sample and d and i of the substitute sample are defined as the actual sample-substitute sample model 141.

In addition, since the etching of the to-be-etched film in which no obstacle (mask) exists is performed for h of the actual sample and o of the substitute sample, a mathematical expression as shown in Formula (4) can be defined as the actual sample-substitute sample model 141.

[Math. 4]

$$h \approx o \tag{4}$$

As described above, the present embodiment can also be applied to the actual sample-substitute sample model 141 in which a quantitative relationship is not defined between some elements of the processing output of the actual sample and the processing output of the substitute sample.

For example, when the target processing output 101 including the value of h is input, the analysis system 40 searches for the processing output of the substitute sample satisfying Formula (4). Based on the above-described properties (actual sample-substitute sample model 141), the analysis system 40 searches for the processing output of the substitute sample, of which o is large, i is small, and d is large, from the found processing output of the substitute sample. Furthermore, the analysis system 40 calculates the target processing condition 150 by using the found processing output of the substitute sample and the processing output-processing condition model 140. By performing the above-described calculation processing, it is possible to calculate the processing conditions for obtaining an actual sample having a deep vertical shape.

Although the substitute sample having the transparent roof has been described as an example, the present invention is not limited thereto. For example, a substitute sample having an opaque roof can be used. In this case, it is possible to measure a thickness of a light interference film by taking out the substitute sample from the device and removing the entire hut or a part of the hut corresponding to the space used as an optical path at the time of optical measurement. Therefore, it is possible to acquire learning data at a high speed and at a low cost, as compared with the case of using the actual sample.

It should be noted that a wafer in which a film is formed using the same material as that of the trench portion of the actual sample is used as the substitute sample, but the present invention is not limited thereto. For example, a material exhibiting processing characteristics similar to those of the trench portion, or a material having a correlation with the processed shape of the trench portion can also be applied.

Figure 12:
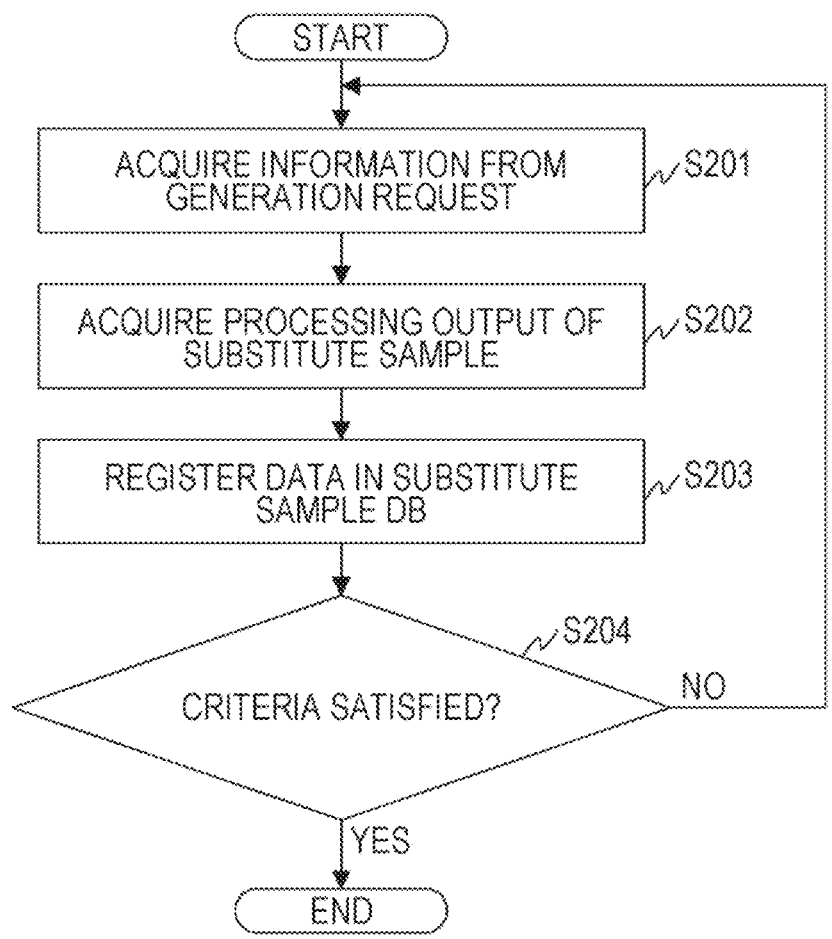
FIG. 12 is a flowchart illustrating an example of processing of generating a substitute sample DB, which is performed by the analysis system according to the first embodiment.
Figure 13:
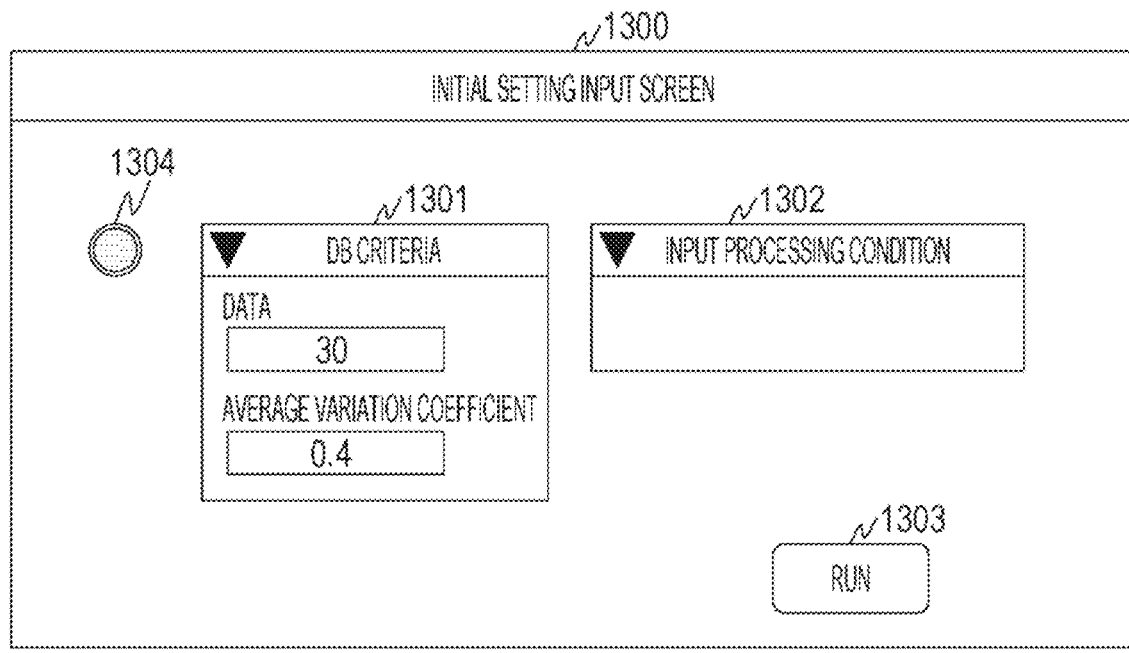
FIG. 13 is a diagram illustrating an example of a GUI displayed on the substitute sample terminal according to the first embodiment.
Figure 14:
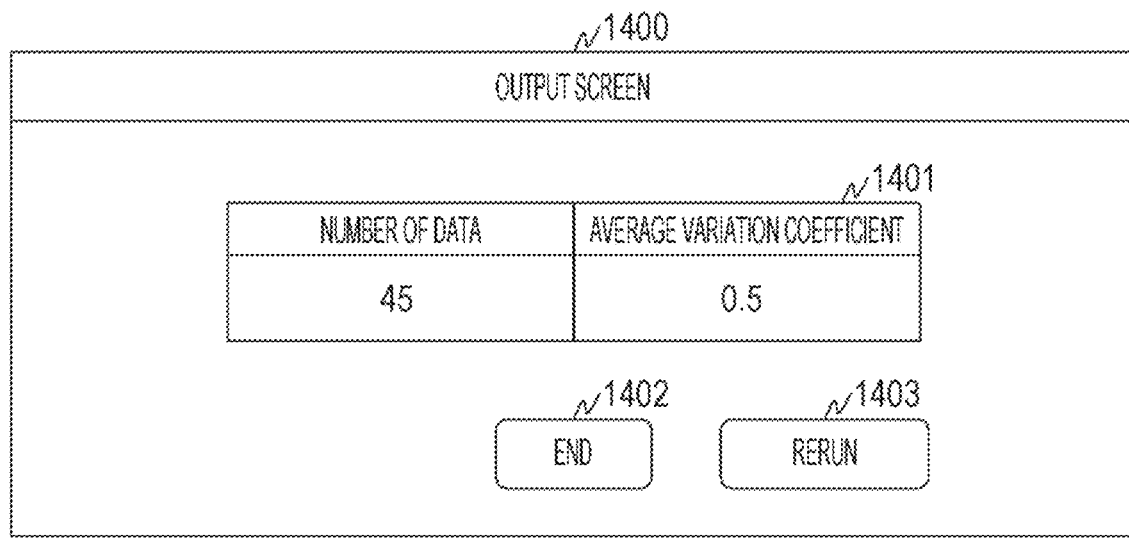
FIG. 14 is a diagram illustrating an example of a GUI displayed on the substitute sample terminal according to the first embodiment.

Next, a method of generating the substitute sample DB 131 will be described. FIG. 12 is a flowchart illustrating an example of processing of generating the substitute sample DB 131, which is performed by the analysis system 40 according to the first embodiment. FIGS. 13 and 14 are diagrams illustrating an example of a GUI displayed on the substitute sample terminal 10 according to the first embodiment.

A user who uses the substitute sample terminal 10 performs an initial setting for generating the substitute sample DB 131 by using a GUI 1300 illustrated in FIG. 13. Here, the GUI 1300 will be described.

The GUI 1300 includes a DB criteria column 1301, an input processing condition column 1302, a run button 1303, and a lamp 1304.

The DB criteria column 1301 is a column for setting the criteria of the substitute sample DB 131 to be constructed, and includes a column for setting the criteria for a total number of input data and an average variation coefficient. Here, the average variation coefficient is obtained by calculating a variation coefficient for each variable of the substitute sample processing output and taking an average of all variables.

The input processing condition column 1302 is a column for setting the input processing condition 100. It should be noted that, instead of inputting a specific value, a column for selecting a means for automatically generating the input processing condition 100 may be provided. For example, a test design method, a random selection method, a selection method based on a sparse region to be described later, or the like can be selected. A plurality of selecting means may be combined.

The run button 1303 is an operation button for designating the execution of the processing of generating the substitute sample DB 131.

The lamp 1304 indicates whether the input to the DB criteria column 1301 or the input processing condition column 1302 is valid. It should be noted that, in addition to the lamp 1304, a pop-up display and a sound reproduction may be performed. It should be noted that the lamp 1304 is also turned on even when a valid value is input to only the input processing condition column 1302.

When the user sets a value in each column and operates the run button 1303, the substitute sample terminal 10 transmits the input processing condition 100 to the processing device 20, and requests the analysis system 40 to generate the substitute sample DB 131. The generation request includes the total number of data, the average variation coefficient, the input processing condition 100, and the like.

When the analysis unit 130 receives the generation request of the substitute sample DB 131, the analysis unit 130 starts the processing of generating the substitute sample DB 131, as described below.

First, the analysis unit 130 acquires information included in the received generation request (step S201). At this time, the analysis unit 130 holds the total number of data and the average variation coefficient included in the generation request as the criteria of the substitute sample DB 131. In addition, the analysis unit 130 temporarily holds the input processing condition 100 included in the generation request.

Subsequently, the analysis unit 130 acquires the processing output of the substitute sample from the processing device 20 (step S202). It should be noted that the processing output is the processing output of the processing performed based on the input processing condition 100.

Subsequently, the analysis unit 130 registers data in the substitute sample DB 131 (step S203). Specifically, the analysis unit 130 registers the processing condition of the substitute sample and the processing output in association with each other in the substitute sample DB 131.

Subsequently, the analysis unit 130 determines whether the substitute sample DB 131 satisfies the criteria (step S204). Specifically, the following calculation processing is performed.

The analysis unit 130 sets the total number of data and the average variation coefficient to 0.

The analysis unit 130 refers to the substitute sample DB 131 and holds the number of registered entries as the total number of data.

The analysis unit 130 refers to the substitute sample DB 131 and calculates an average variation coefficient for the processing output in the substitute sample processing output space 611. The analysis unit 130 holds the value of the calculated average variation coefficient.

The analysis unit 130 determines whether the total number of data is larger than a designated number and the average variation coefficient is larger than a designated numerical value. When the above-described condition is satisfied, the analysis unit 130 determines that the substitute sample DB 131 satisfies the criteria. So far, the processing of step S204 has been described.

When it is determined that the substitute sample DB 131 does not satisfy the criteria, the analysis unit 130 returns to step S201 and performs similar calculation processing. At this time, the analysis unit 130 performs a display that urges an input of a new processing condition to the substitute sample terminal 10.

If it is determined that the substitute sample DB 131 satisfies the criteria, the analysis unit 130 ends the processing of generating the substitute sample DB 131. At this time, the analysis unit 130 generates display information for displaying a GUI 1400 as illustrated in FIG. 14, and transmits the display information to the substitute sample terminal 10. Here, the GUI 1400 illustrated in FIG. 14 will be described.

The GUI 1400 includes a result display column 1401, an end button 1402, and a rerun button 1403.

The result display column 1401 is a column for displaying information on the generated substitute sample DB 131. In FIG. 14, the total number of data and the average variation coefficient are displayed. It should be noted that details of the entries registered in the substitute sample DB 131 may be displayed.

The end button 1402 is an operation button for ending the processing of generating the substitute sample DB 131. When the user operates the end button 1402, the GUI 1400 is closed. It should be noted that the analysis unit 130 may end the processing of generating the substitute sample DB 131 when the end button 1402 is operated.

The rerun button 1403 is an operation button for executing the processing of generating the substitute sample DB 131 again. When the user operates the rerun button 1403, the GUI 1300 is displayed.

It should be noted that the following criteria can also be adopted as the criteria of the substitute sample DB 131. When the processing output of the substitute sample DB 131 is the same as the processing output of the target substitute sample, or when the processing output close to the processing output of the target substitute sample is present in the substitute sample processing output space 611, it is determined the substitute sample DB 131 satisfies the criteria. The use of such criteria makes it possible to generate the substitute sample DB 131 with high calculation accuracy of the target processing condition 150.

Figure 15:
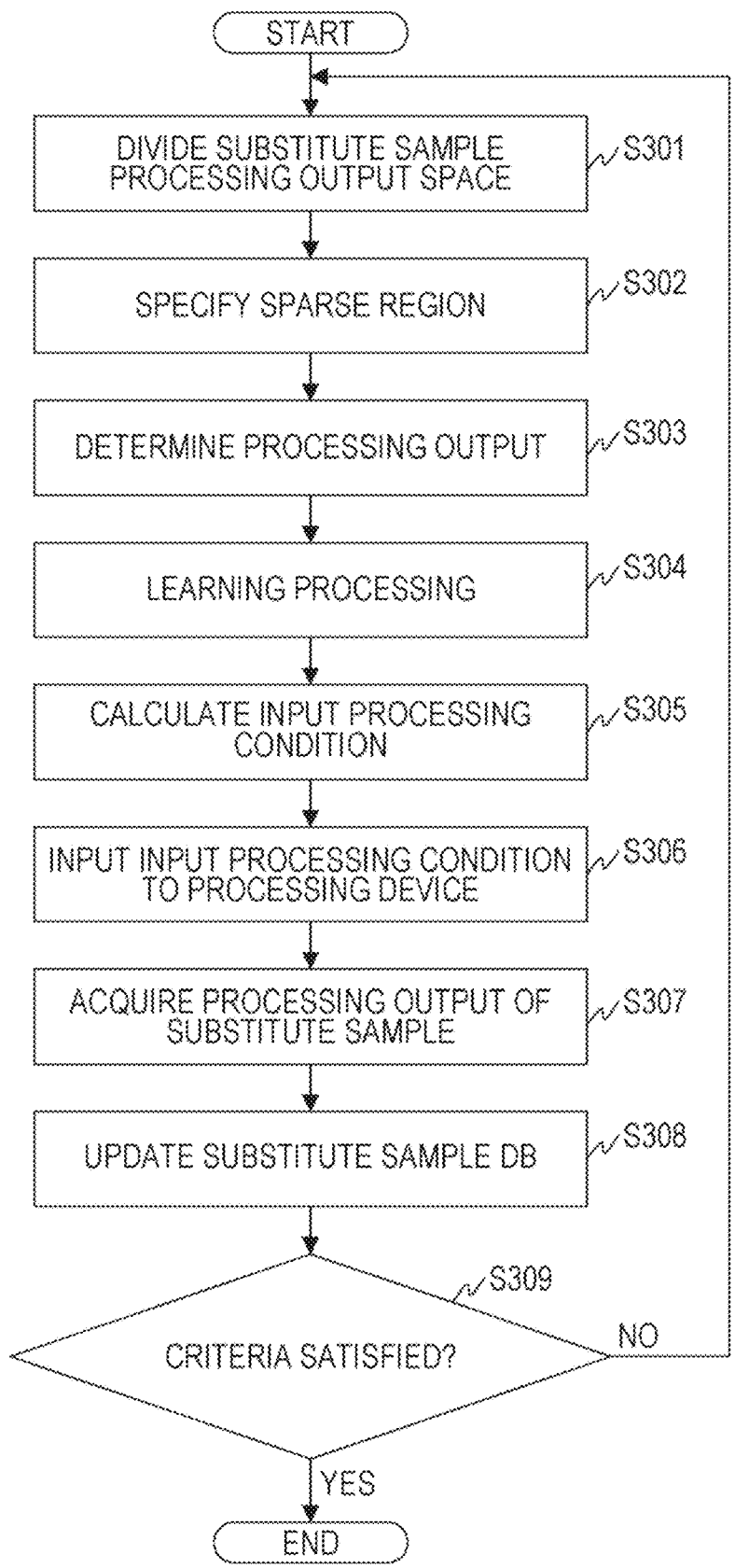
FIG. 15 is a flowchart illustrating an example of processing of updating the substitute sample DB, which is performed by the analysis system according to the first embodiment.
Figures 16, 17:
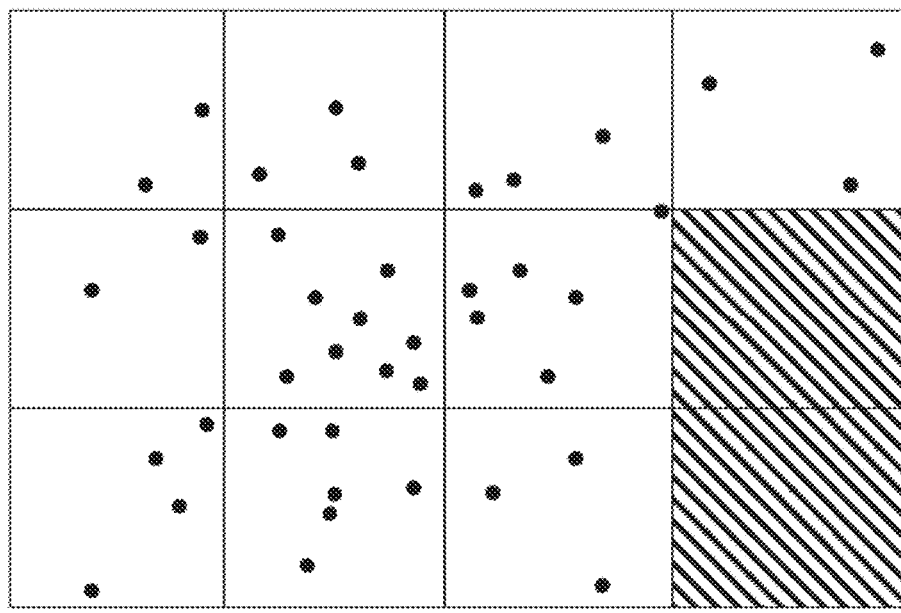
FIG. 16 is a diagram illustrating an example of a method of dividing a substitute sample processing output space according to the first embodiment.
FIG. 17 is a diagram illustrating an example of a GUI displayed on the substitute sample terminal according to the first embodiment.

FIG. 15 is a flowchart illustrating an example of processing of updating the substitute sample DB 131, which is performed by the analysis system 40 according to the first embodiment. FIG. 16 is a diagram illustrating an example of a method of dividing the substitute sample processing output space 611 according to the first embodiment. FIG. 17 is a diagram illustrating an example of a GUI displayed on the substitute sample terminal 10 according to the first embodiment.

A user who uses the substitute sample terminal 10 makes a setting for updating the substitute sample DB 131 by using a GUI 1700 illustrated in FIG. 17. Here, the GUI 1700 will be described.

The GUI 1700 includes a DB criteria column 1701, a sparse region column 1702, a learning processing type column 1703, a determination button 1704, and a lamp 1705.

The DB criteria column 1701 is a column for setting the criteria of the substitute sample DB 131, and includes a column for setting a total number of input data and an average variation coefficient.

The sparse region column 1702 is a column for setting a sparse region that is a selection criteria of the input processing condition 100, and includes a column for setting the number of divisions of the substitute sample processing output space 611, the number of data included in the divided region, and an upper limit of the input processing condition 100 to be added. The number of data included in the divided region is used as an index for determining whether the divided region is a sparse region.

The learning processing type column 1703 is a column for selecting a specific calculation method of the learning processing using the substitute sample DB 131. In the learning processing type column 1703 of the present embodiment, a check box for selecting a calculation method is displayed.

The determination button 1704 is an operation button for registering the input of each column.

The lamp 1705 indicates whether the input to the DB criteria column 1701, the sparse region column 1702, and the learning processing type column 1703 is valid. It should be noted that, in addition to the lamp 1705, a pop-up display and a sound reproduction may be performed.

When the user sets a value to each column and operates the determination button 1704, the substitute sample terminal 10 transmits the setting information to the processing device 20.

When the processing of generating the substitute sample DB 131 is completed, when the setting information is received, or when an update instruction is received from the user, the analysis unit 130 performs update processing of the substitute sample DB 131, as described below. It should be noted that the analysis unit 130 may periodically perform the updating processing of the substitute sample DB 131.

First, the analysis unit 130 divides the substitute sample processing output space 611 into a plurality of divided regions based on the value set in the sparse region column 1702 (step S301). For example, when the substitute sample processing output space 611 is two-dimensional, the substitute sample processing output space 611 is divided as illustrated in FIG. 16.

Subsequently, the analysis unit 130 specifies a sparse region from among the divided regions based on the value set in the sparse region column 1702 (step S302).

Specifically, the analysis unit 130 specifies the sparse region based on the number of processing outputs included in the divided region. For example, in the example illustrated in FIG. 16, a diagonally shaded divided region including no point representing the processing output among the divided regions included in the substitute sample processing output space 611 is specified as the sparse region.

When the number of sparse regions is large, the analysis unit 130 may select a part of the sparse regions. As the selecting method, a random selecting method, a method of selecting a divided region existing in the vicinity of the divided region including the processing output of the target substitute sample, and the like can be considered. When the latter selecting method is employed, there is a possibility that the prediction accuracy of the target processing condition 150 can be improved.

In addition, as another method, the analysis unit 130 specifies a predetermined number of divided regions as the sparse region in ascending order of the number of processing outputs.

It should be noted that the specifying criteria and the specifying method for the sparse region are only examples, and the present invention is not limited thereto.

Subsequently, the analysis unit 130 determines an arbitrary processing output from the sparse region (step S303). For example, a method of randomly determining the processing output from the sparse region or a method of determining the processing output from a relative position in the sparse region can be considered.

Subsequently, the analysis unit 130 performs learning processing based on the value set in the learning processing type column 1703 and the substitute sample DB 131 (step S304), and generates the processing output-processing condition model 140.

It is noted that, when the existing processing output-processing condition model 140 is present, the processing of step S304 may be omitted.

It should be noted that the analysis unit 130 may obtain the accuracy of the generated processing output-processing condition model 140, and perform the learning processing again when the accuracy is lower than a threshold value. For example, the analysis unit 130 evaluates the accuracy of the processing output-processing condition model 140 by performing cross verification and determining whether a verification error is greater than the threshold value.

Subsequently, the analysis unit 130 calculates the input processing condition 100 based on the processing output and the processing output-processing condition model 140 determined in step S303 (step S305).

Subsequently, the analysis unit 130 inputs the input processing condition 100 to the processing device 20 (step S306).

Subsequently, the analysis unit 130 acquires the processing output of the substitute sample from the processing device 20 (step S307).

Subsequently, the analysis unit 130 updates the substitute sample DB 131 (step S308). Specifically, the analysis unit 130 registers the input processing condition 100 and the received processing output of the substitute sample in the substitute sample DB 131 in association with each other.

Subsequently, the analysis unit 130 determines whether the substitute sample DB 131 satisfies the criteria, based on the value set in the DB criteria column 1701 (step S309). Criteria similar to the criteria of step S205 can be applied as the criteria of step S309.

When it is determined that the substitute sample DB 131 does not satisfy the criteria, the analysis unit 130 returns to step S301 and performs similar calculation processing.

If it is determined that the substitute sample DB 131 satisfies the criteria, the analysis unit 130 ends the processing of updating the substitute sample DB 131.

As described above, according to the present embodiment, the analysis system 40 does not need to acquire learning data from the actual sample and perform learning. That is, the analysis system 40 can calculate the target processing condition 150 of the actual sample from the target processing output 101 of the actual sample. In the present embodiment, the processing condition of the actual sample can be obtained at a high speed and at a low cost by collecting the learning data using the substitute sample that is less expensive and easier to measure than the actual sample and performing the learning processing using the acquired data. That is, it is possible to reduce the process development cost and obtain the highly accurate processing condition.

Furthermore, since the number of elements included in the processing output of the substitute sample can be equal to or less than the number of elements included in the processing output of the actual sample, the measurement time, the analysis time, and the like can be shortened.

Next, another embodiment of the present invention will be described.

First, the actual sample-substitute sample model in the analysis system 40 illustrated in FIG. 1 will be additionally described. If there is a DB of the actual sample output and the substitute sample output for the same processing condition, the DB can be stored in the model DB 132 and input to the analysis unit 130 so that a correlation can be learnt by the analysis method of the analysis unit 130. An actual sample-substitute sample relationship model can be stored by storing this result in the model DB 132.

In addition, even if the actual sample-substitute sample relationship model is not a quantitative relationship but a qualitative correspondence relationship, the target substitute sample output can be determined. For example, a case where there is a qualitative actual sample-substitute sample relationship model, such as "A is larger as B is larger with respect to a variable A of the substitute sample output and a variable B of the actual sample output", is considered. In addition, a case where a maximum possible value B* of B is the target actual sample output is considered. At this time, it is possible to determine that the substitute sample output corresponding to the target actual sample output is a maximum possible value A* of A.

Then, in the output of the processing condition that gives the target actual sample output, the solution that becomes the processing condition for giving the obtained target substitute sample output is estimated by using a sample output-processing condition model for the substitute sample obtained by the analysis. In addition, without using the sample output-processing condition model, data having the substitute sample output closest to the obtained target substitute sample output is referred to from a substitute sample database stored in the model DB 132, and the processing condition of the data may be output as the solution. As described above, in a case where the number of actual samples is limited and the condition search using the actual sample cannot be performed sufficiently, the target processing condition can be searched for by using the substitute sample DB and the previously known actual sample-substitute sample relationship model.

In addition, in an additional processing condition determination procedure described with reference to FIG. 15, it is also possible to designate a sparse region including the coordinates of the obtained target substitute sample output or a sparse region around the coordinates from among all the sparse regions. By designating the sparse region in this manner, it is possible to intensively increase the data around the target substitute sample output and improve the prediction accuracy of the target actual sample processing condition. In addition, an example of the DB criteria will be described. It is possible to determine that the criteria are satisfied when a data point of the obtained target substitute sample output or its neighboring data is included in the DB. With such criteria, it is possible to establish a DB including data around the target substitute sample output.

In addition, in FIGS. 8A, 8B, 10A, and 10B, the description has been given by using the processing characteristics of the to-be-etched film when the substitute sample is exposed to the plasma. The substitute sample can measure the characteristics of the medium in the vicinity of the opening of the hut. The method measures the state in which each target film inside and outside the hut is processed, that is, the etching amount o outside the hut, the etching amount i inside the hut, the characteristic length d of attenuation of the etching amount inside the hut, or the characteristic length d of attenuation of the thickness of the to-be-etched film from the back of the hut to the opening.

Therefore, the medium inside the processing chamber or in the vicinity of the hut opening is not limited to the plasma, but includes a corrosive gas, a radical-containing gas, a mist reacting with a film to be processed, aerosol, and the like.

In addition, in a case where the medium is the plasma, a sheath is formed on the surface of the substitute sample, and thus, when positive ions in the plasma are incident on the surface of the substitute sample, the positive ions are accelerated in a direction perpendicular to a wafer. Therefore, positive ions from the plasma, radicals, and a plasma generation source gas are incident on the outside of the hut. On the other hand, the incidence of the positive ions is suppressed in a gap inside the hut, and only the plasma generation source gas and the radicals are diffused into the gap inside the hut. Therefore, the characteristics of the plasma can be measured by measuring the etching amount inside and outside the hut.

However, the sheath is formed along the surface of the substitute sample, and thus the caution is required because the sheath is distorted around the opening of the roof (hut cover). The distortion of the sheath will be described below with reference to FIG. 24. The roof is also referred to as the hut cover in this specification.

Figure 24:
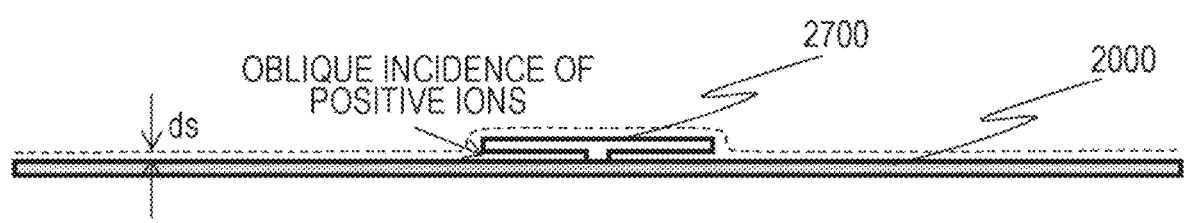
FIG. 24 is a diagram illustrating an example of a substitute sample including openings on both sides.

In FIG. 24, a dashed line extending from an imaging element 2610 to a lens 2620, a hut cover 2700, and a wafer 2000 is an outline of an optical path of interference light used for measuring a film thickness. A circle portion drawn by a dashed line on the surface of the wafer 2000 is an observation region. The area of the observation region can be changed by changing a focal length of the lens 2620 and an area of the imaging element 2610.

By widening the observation region beyond the hut cover, it is possible to measure the thickness of the to-be-etched film at places other than the hut cover.

In addition, it is possible to install a plurality of hut covers on the wafer 2000. In this case, the in-plane distribution of the wafer can be measured with respect to the thickness of the to-be-etched film inside and outside the hut cover.

As in FIGS. 8B and 10B, the base film and the to-be-etched film are stacked on the surface of the wafer 2000.

The thickness of the to-be-etched film can be measured by irradiating the to-be-etched film with light and measuring interference light emitted from the to-be-etched film.

As the light with which the to-be-etched film is irradiated, a method of installing a light source outside the processing chamber and light generated inside the processing chamber 2001 can be used. As the light generated inside the processing chamber, plasma light generated during plasma processing can be used. A method using an external light source will be described with reference to FIGS. 21 and 22.

When broadband light such as plasma light is used as the light source, it is necessary to perform spectroscopic measurement so as to measure the film thickness from the interference light. With an optical filter 2630, spectroscopic measurement can be performed by limiting a wavelength incident on the camera. A band of the light incident on the camera can be limited by combining a band-pass filter or a low-pass filter and a high-pass filter as the optical filter 2630.

The measurement at a wider angle is enabled by changing the lens 2620 or adding a lens between the optical filter 2630 and the imaging element 2610, and thus the observation region can be widened. As the observation region is widened, the distribution measurement in a wider range is possible.

However, in the measurement at a wide angle, when the interference light passes through the optical filter 2630, the incident angle to the optical filter 2630 decreases as the optical path is far away from the central axis of the optical path of the interference light. As the incident angle decreases from 90°, the wavelength of the passing light is shifted and the transmission efficiency also decreases, and thus the caution needs to be taken in the band-pass filter in which multilayer films are laminated. By estimating in advance the angle at which the interference light from each place of the observation region passes through the optical filter 2630 and calculating the actual transmission wavelength by using the incident angle dependence of the transmission wavelength of the optical filter 2630, it is possible to measure the thickness of the to-be-etched film in a wide observation region.

In addition, in the measurement at a wide angle, since the light emitted from the light source toward the to-be-etched film is obliquely incident on the to-be-etched film, the optical path in the to-be-etched film is changed depending on the incident angle. Therefore, the intensity of the interference light from each place of the observation region also has dependence on the incident angle of the light from the light source with respect to the to-be-etched film. Therefore, the thickness of the to-be-etched film can be measured with high accuracy in the wide observation region by estimating the angle dependence of the intensity of the interference light generated when the light is incident on the to-be-etched film and calculating the intensity of the interference light having the wavelength to be measured.

Instead of using the incident angle dependence of the light estimated with respect to the optical filter 2630 and the incident angle dependence of the light estimated with respect to the to-be-etched film, there is a method of measuring the thickness of the to-be-etched film by measuring an actual interference light intensity distribution at the time of film thickness change of the to-be-etched film and using temporal change data of the interference light intensity at each measurement position at that time as a database. The film thickness distribution of the to-be-etched film can be measured with high accuracy by correlating the actual film thickness to the measurement position and the measurement time of the interference light and comparing the database with the interference light at the time of measuring the film thickness of the to-be-etched film having the same film type as that when acquiring the database.

By using a hyperspectral camera that can disperse the light incident on each element of the imaging element 2610, it is not necessary to use the optical filter 2630. In addition, the use of the broadband light as the light source makes it possible to acquire the spectroscopic measurement result over multiple wavelengths, thereby improving the accuracy of the film thickness measurement.

In addition, although the wavelength at which the interference light can be measured may be limited by the relationship between the loss coefficient and the refractive index of the to-be-etched film and the laminated film or space before and after the to-be-etched film, it is possible to use the wavelength at which the film thickness can be measured by measuring a plurality of wavelengths.

As the method of easily selecting the wavelength and measuring the interference film, filters having different transmission wavelengths can be set in a filter wheel (filter changer) and filters can be selected.

When the axial direction parallel to A-A', that is, a direction from the opening of the hut cover to the back side is the X axis, it is possible to evaluate characteristics of a medium such as plasma for processing the to-be-etched film in the vicinity of the opening by measuring the X-axis direction distribution of the film thickness distribution of the to-be-etched film in the hut cover.

Furthermore, in a case where the characteristics of the plasma or the like for processing the to-be-etched film in the vicinity of the opening of the hut cover are uniform, the X-axis direction distribution of the thickness of the to-be-etched film has a similar absolute value at an arbitrary position distant from both sides of the hut. That is, it is possible to measure the axial direction distribution at an arbitrary position in the central part of the hut.

In addition, the measurement and the characteristic evaluation of the X-axis direction distribution are possible at an arbitrary position within a range where the gap of the hut cover is present. Therefore, when it is sufficient to measure one axis, it is possible to use a line-scan type camera.

With the above-described system using the camera, it is possible to acquire a substitute sample output at a very large number of points within the observation region with the number of pixels of the imaging element as the upper limit.

Figure 19:
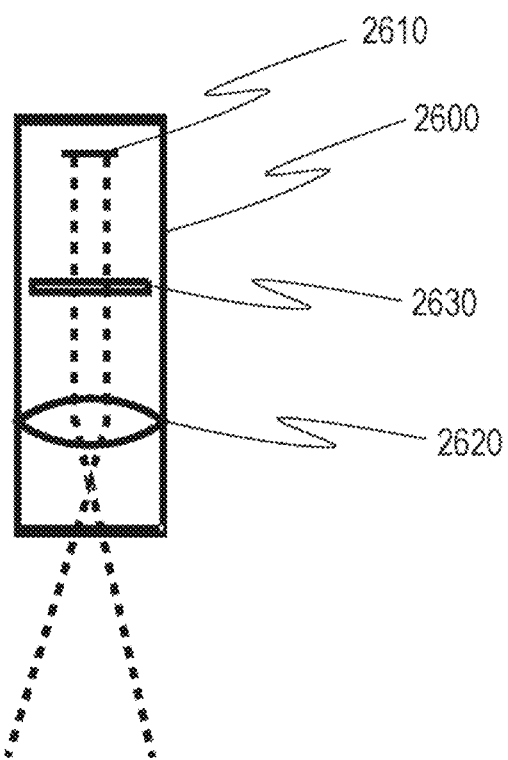
FIG. 19 is a diagram illustrating an example of an optical system in the camera system for substitute sample output measurement.

In FIG. 19, the lens 2620 for making the optical path from the lens 2620 to the imaging element 2610 telecentric is used. The incident angle of the interference light to the optical filter 2630 can be made vertical by providing the optical filter 2630 in the telecentric optical path portion. This makes it possible to avoid the shift and attenuation of the transmission wavelength that would occur when the interference light is obliquely incident on the optical filter 2630. In addition, it is possible to use the small optical filter 2630 having a similar size to the imaging device.

Figure 20:
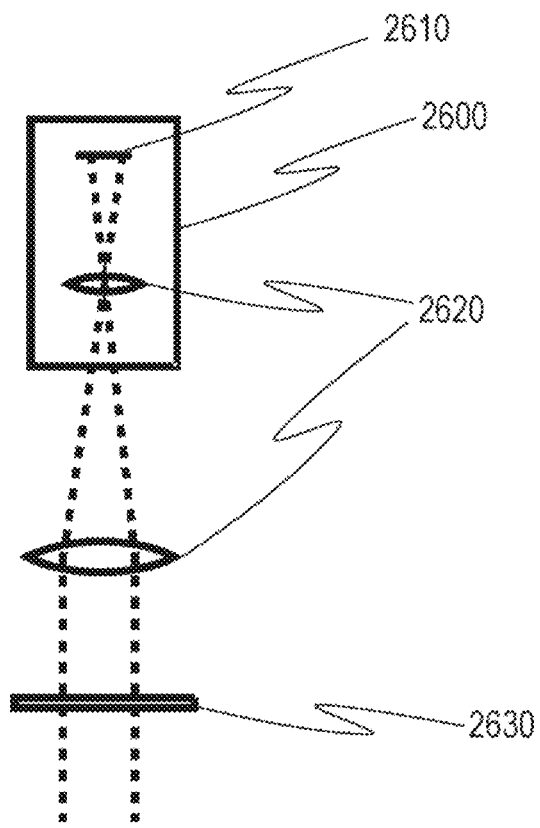
FIG. 20 is a diagram illustrating an example of an optical system in the camera system for substitute sample output measurement.

In FIG. 20, the lens 2620 for making the optical path from the lens 2620 to the wafer telecentric is used. The incident angle of the interference light to the optical filter 2630 can be made vertical by providing the optical filter 2630 in the telecentric optical path portion. This makes it possible to avoid the shift and attenuation of the transmission wavelength that would occur when the interference light is obliquely incident on the optical filter 2630. It should be noted that the lens 2620 can be configured by adding an additional lens to the lens mounted in the camera. In addition, a target optical path can be obtained by using the method of replacing the lens inside the camera with the lens for obtaining the target optical path or by using only the additional lens.

Figure 21:
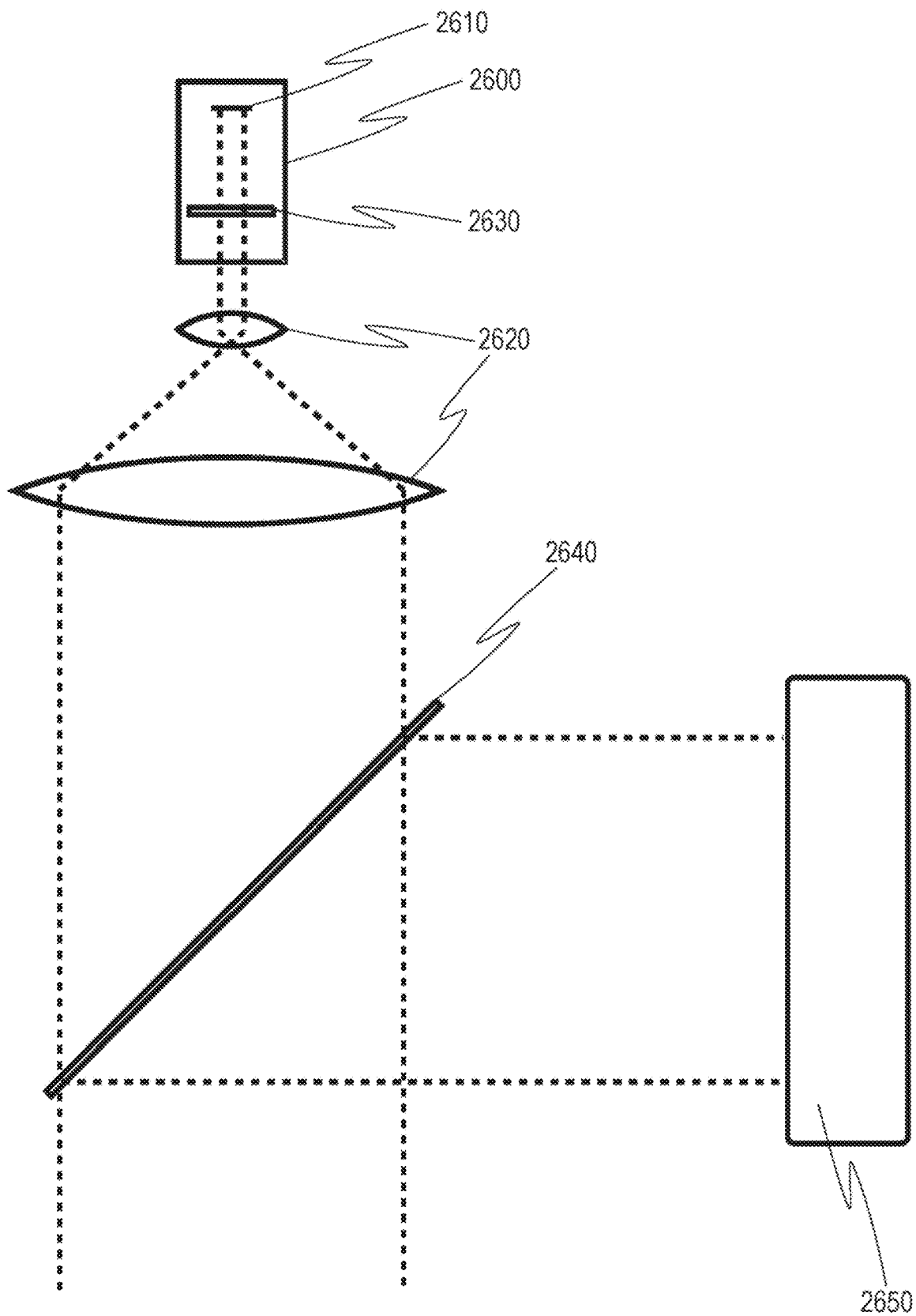
FIG. 21 is a diagram illustrating an example of an optical system and an external light source in the camera system for substitute sample output measurement.

In FIG. 21, the lens 2620 for making the optical path before and after the lens 2620 telecentric is used. In addition, a half mirror 640 is provided in the optical path from the lens 2620 to the wafer, and the light from the light source 2650 is made incident on the half mirror 2640. With this configuration, the light from the light source 2650 generates the interference light in the observation region in a perpendicular direction from the half mirror 2640 to the wafer. The interference light from the observation region can return to the half mirror 2640 again, and the light having passed through the half mirror 2640 can be measured by the camera.

It should be noted that, in the method of FIG. 21, the optical path of the light from the light source and the optical path of the interference light are coaxial between the camera 2600 and the wafer 2000, and thus, when the optical path from the lens 2620 to the wafer 2000 is set to a wide angle, it is necessary to pay attention to the fact that the observation range and the interference light capable of being measured by the camera are significantly reduced as the optical path is wide.

The half mirror 2640 can be provided on the imaging element side from the lens 2620. In that case, a small half mirror 2640 having a similar size to the imaging element can be used.

The wavelength band of the light source 2650 and the wavelength band of the transmission and reflection of the half mirror 2640 need to be about the same as or wider than the transmission band of the optical filter 2630. In addition, when simultaneous spectroscopic measurement of multiple wavelengths is performed by using the above-described hyperspectral camera or the like, it is desirable to use the light source 2650 as a broadband light source. In addition, it is desirable that the wavelength band of the transmission and reflection of the half mirror be substantially equal to or wider than the band of the light source 2650.

As the light source 2650, an LED, a Xe lamp, a halogen lamp, a deuterium lamp, a fluorescent lamp, or a laser can be used. However, when a narrow band light source such as a laser is used, it is necessary to match the transmission wavelengths of the optical filter 2630 and the half mirror 2640 with the wavelength range of the laser.

It is desirable that the light from the light source 2650 be incident on the half mirror 2640 as telecentric light by using a lens, a mirror, or the like. In addition, it is possible to increase the amount of light and widen the wavelength band by configuring the light source 2650 with a large number of light sources.

Figure 22:
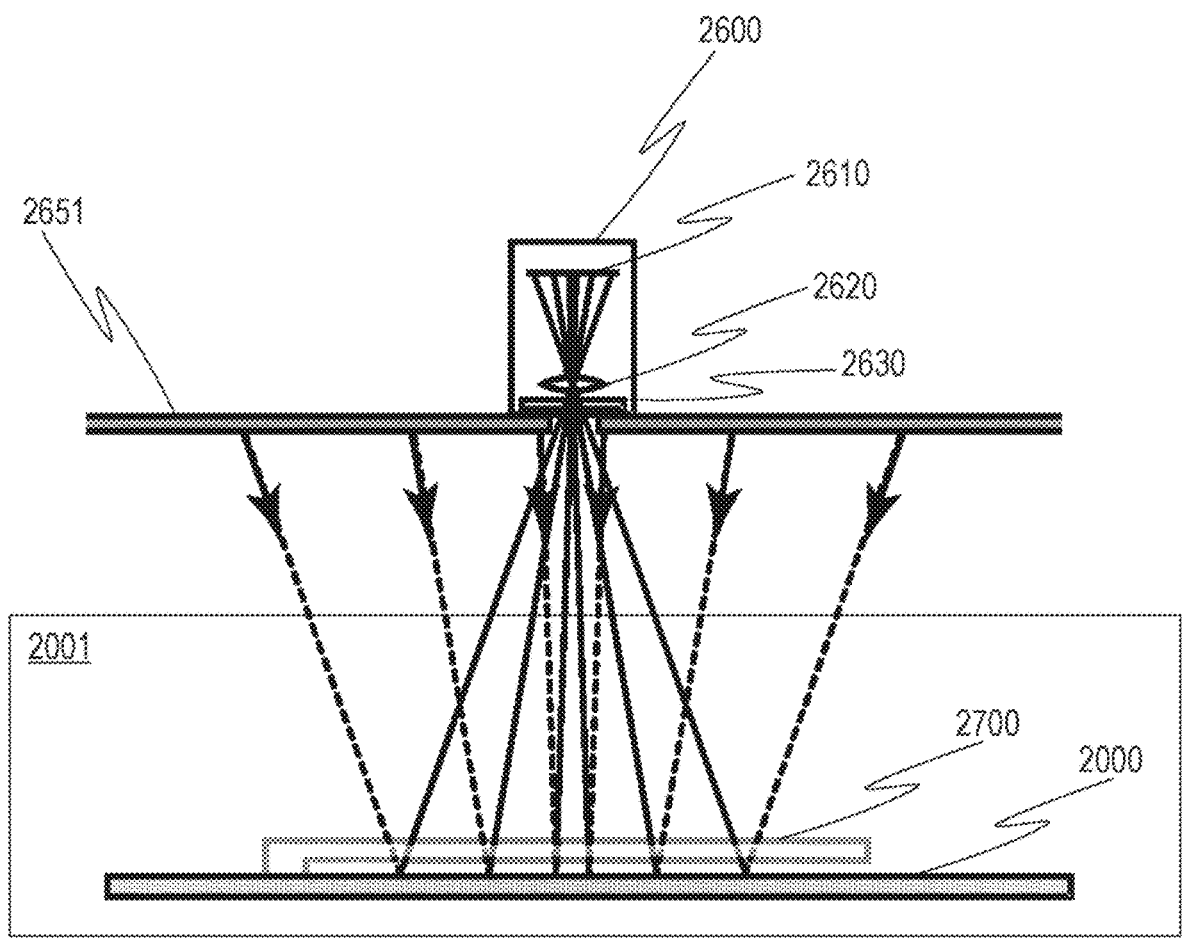
FIG. 22 is a diagram illustrating an example of an optical system and an external illumination in the camera system for substitute sample output measurement.

In FIG. 22, an illumination 2651 is used as the light source. The illumination 2651 is a light source configured by a large number of light sources or is a surface-emitting type light source, and can irradiate the entire wafer 2000 with light.

A hole or a window for introducing interference light to the camera 2600 is provided in a central part of the illumination 2651. The light from the illumination 2651 is isotropically emitted from a number of light sources or light emitting surfaces toward the wafer. Therefore, the interference light from the entire observation region can be introduced to the camera 2600. Furthermore, even when the size of the observation region is changed, it is possible to measure the interference light from the entire observation region by changing the lens 2620. Arrows in FIG. 22 and dashed lines and solid lines following the arrows are examples of the optical paths of the light emitted from the illumination 2651 and the interference light introduced to the camera 2600. For the optical path and the optical filter 2630, the configurations of FIGS. 18 and 19 can be used.

Figure 23:
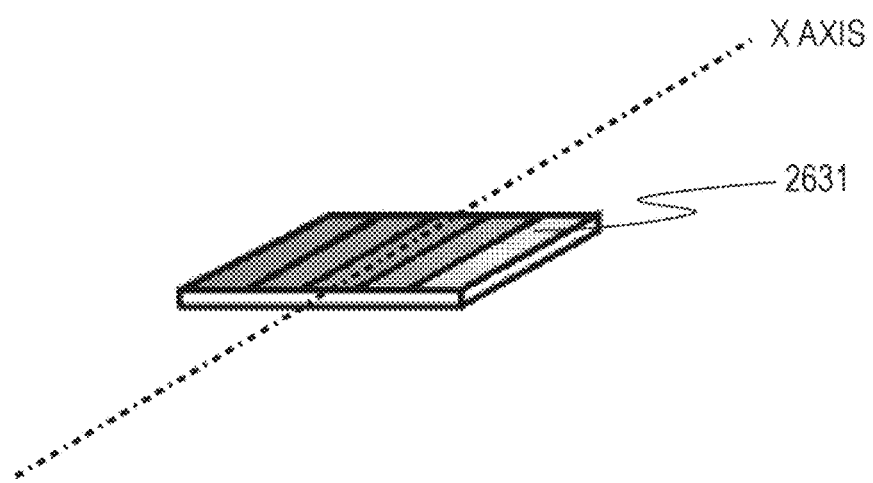
FIG. 23 is a diagram illustrating an example of a multi-optical filter.

FIG. 23 illustrates a multi-optical filter 2631 that selectively transmits a plurality of wavelengths. The plurality of wavelengths can be selectively transmitted by arranging a plurality of optical filters 2630 having different transmission wavelengths. As described above, the axial direction distribution from the opening of the hut cover toward the back side can be measured at an arbitrary position inside the hut cover. Therefore, when an axis in a direction of transmitting only the same wavelength of the multi-optical filter 2631 is an X axis, the measurement using the plurality of wavelengths can be performed by making the X axes inside the multi-optical filter 2631 and the hut cover be the same direction.

Figure 18:
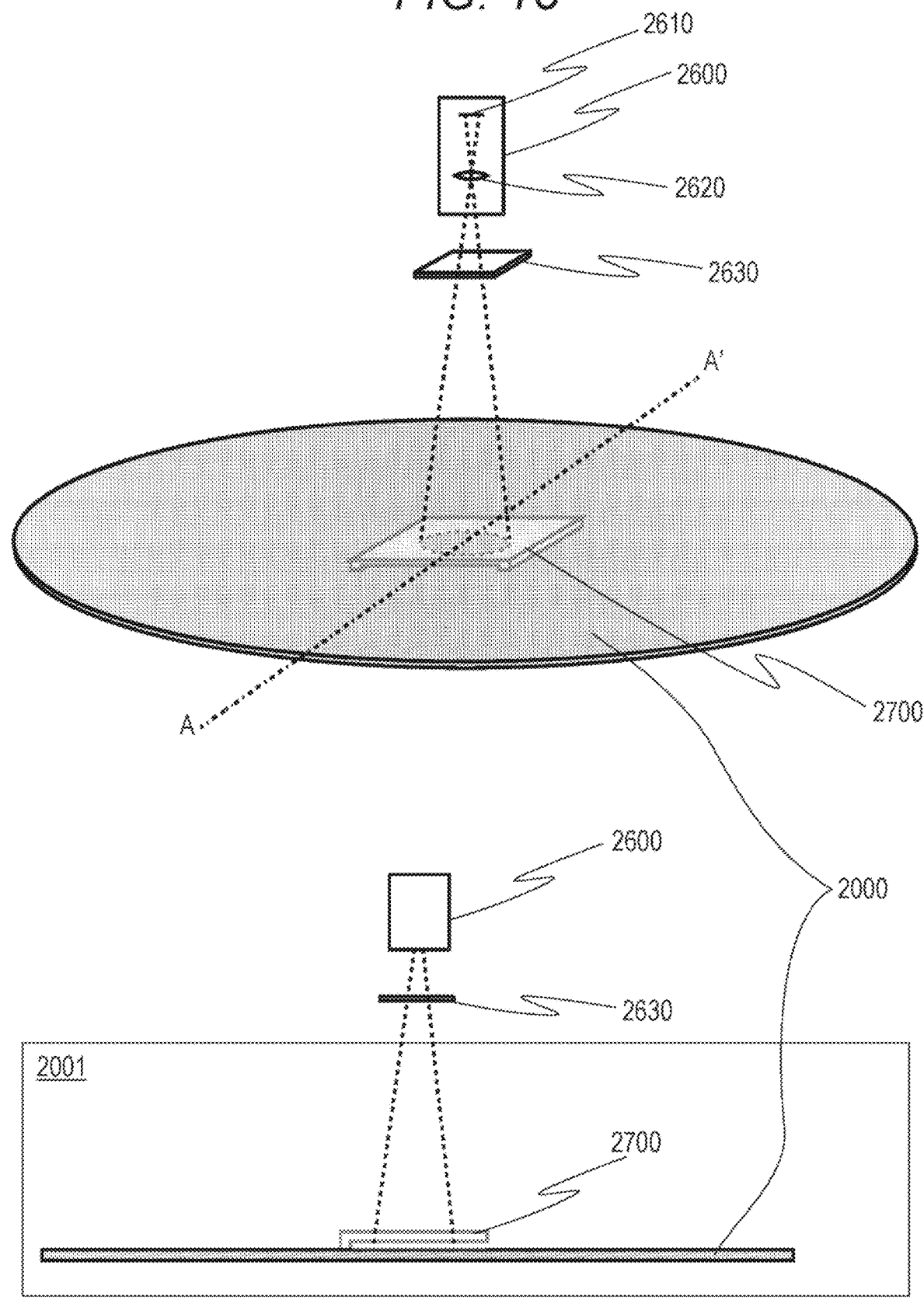
FIG. 18 is a diagram illustrating a method of measuring a substitute sample output using a camera system.

As illustrated in FIGS. 21, 20, and 18, in the case of expanding the optical path toward the wafer 2000 by the lens 2620, a large filter can be provided, and thus the multi-optical filter 2631 having a larger number of transmission wavelengths can be provided. However, as described above, when the optical path has a wide angle, it is necessary to consider the incident angle of the light with respect to the filter and the wafer.

FIG. 24 illustrates the hut cover 2700 that opens both ends of the hut cover of FIG. 18 and has a partition in a central part. Therefore, it is possible to evaluate the characteristics of the medium such as plasma for processing the to-be-etched film around the two left and right openings.

In addition, the partition may be eliminated when the characteristic length d of the attenuation inside the hut is shorter than the length from the hut opening to the partition.

In the case of exposing the substitute sample to plasma, it is necessary to consider the influence of sheath distortion caused by the presence of the hut. The sheath has a thickness ds depending on a plasma density and bias power applied to the wafer, and the sheath is formed along the shape of the hut as indicated by a dashed line in FIG. 24. Since the sheath is distorted along the hut cover, positive ions are obliquely accelerated and incident in the vicinity of the opening of the hut toward the to-be-etched film under the hut cover.

Therefore, the phenomenon of processing the to-be-etched film is different between the vicinity of the opening of the hut into which the positive ions are incident and inside the hut without incident positive ions.

Therefore, it is desirable that the etching amount i inside the hut and the characteristic length d of attenuation of the etching amount inside the hut be obtained by measuring the values divided into the vicinity of the opening of the hut and the inside of the hut.

It is desirable that the position in the vicinity of the opening of the hut and the inside of the hut be a position that is advanced by at least twice the height of the gap in the hut cover in the X axis direction from the opening of the hut. Even when the axial distribution of the to-be-etched film in the vicinity of the opening becomes complicated and it is difficult to measure the characteristic length of attenuation, the measured value inside the hut can be obtained.

Figure 25:
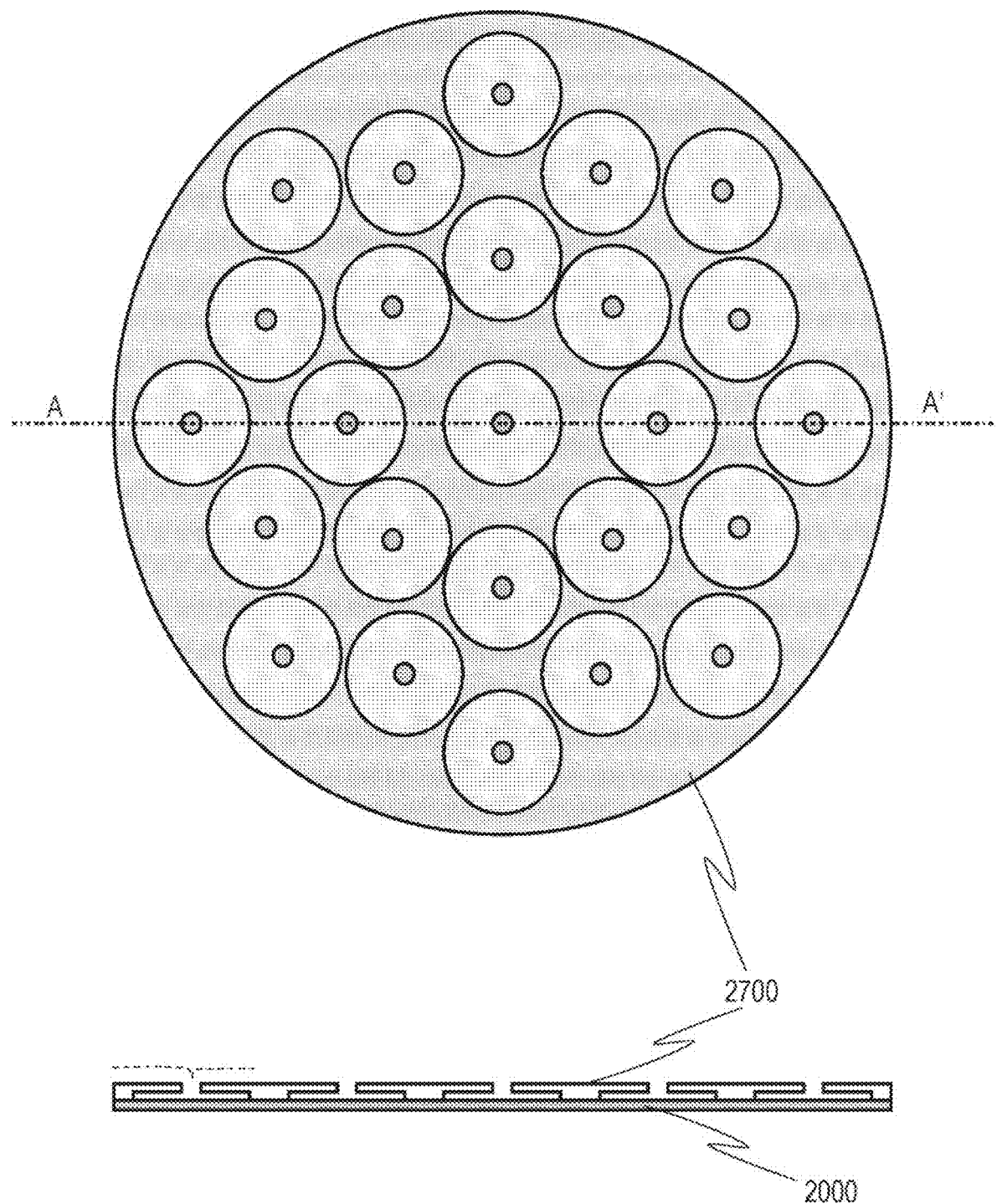
FIG. 25 is a diagram illustrating an example of a substitute sample enabling measurement of an in-plane distribution of a wafer.
Figure 26:
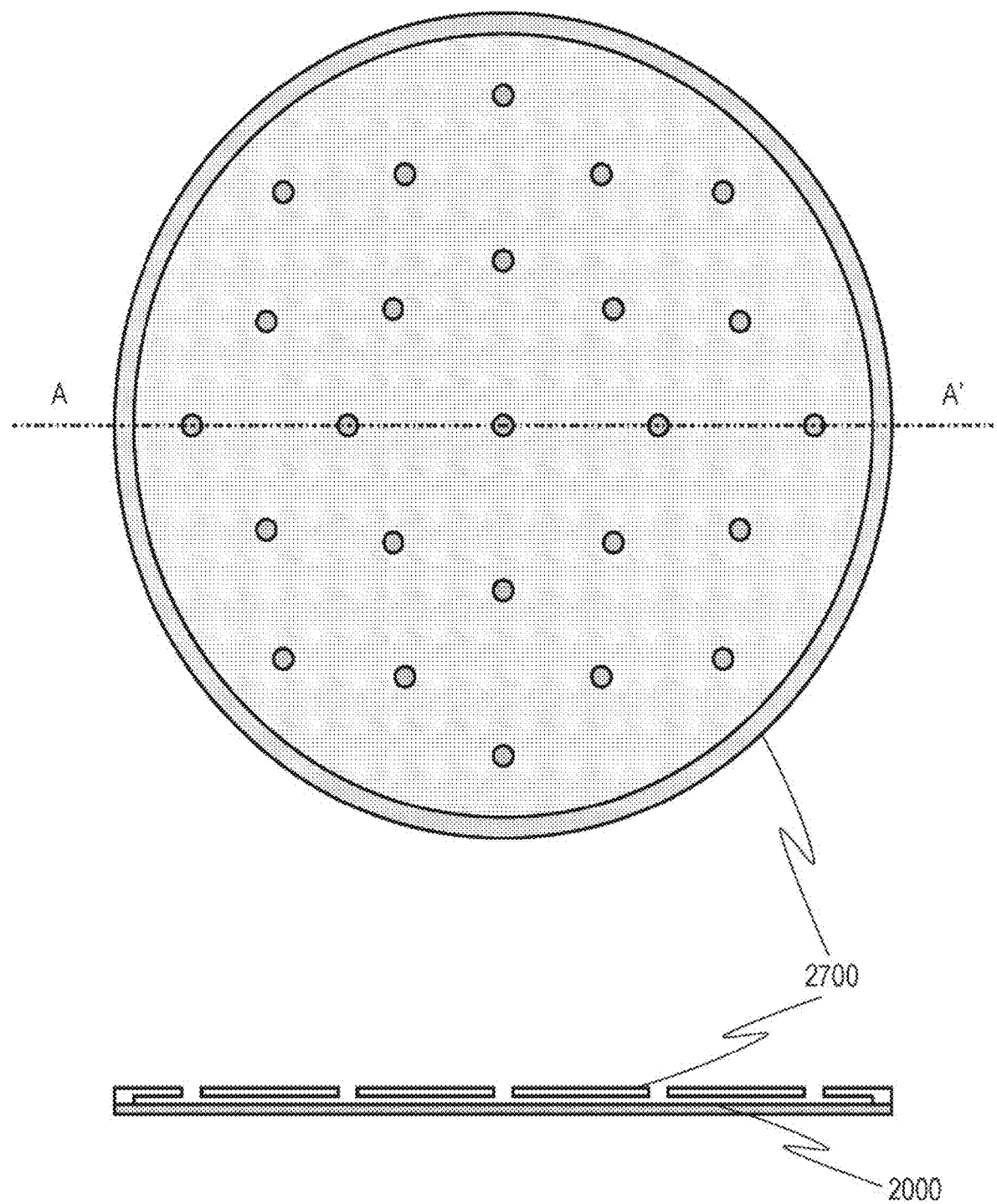
FIG. 26 is a diagram illustrating an example of a substitute sample enabling measurement of an in-plane distribution of a wafer.

FIG. 25 illustrates the hut cover 2700 that covers the entire wafer. By providing a plurality of openings of the hut as holes in the upper part of the hut cover, it is possible to acquire the in-plane distribution of the wafer in the characteristics of the medium such as plasma for processing the to-be-etched film. In FIG. 26, the gap is partitioned by the hut cover so that the inside of the hut has a gap with a certain radius from the opening of the hut, whereby the characteristics of the medium in the vicinity of each opening can be acquired.

In addition, the influence of the distortion of the sheath described above can be suppressed by providing a hole in the upper part of the hut cover. In FIG. 26, since the entire periphery of the hole is the hut cover, the distortion of the sheath can be suppressed by reducing the diameter of the hole. By setting the diameter of the hole to be less than twice the sheath thickness, the distortion of the sheath is alleviated by overlapping the sheath at the central part even if the sheath is distorted from the left and right of the hole to the center, as indicated by the dashed line. The distortion of the sheath can be further suppressed by setting the diameter of the hole equal to or less than the sheath thickness.

When the characteristic length d of the attenuation inside the hut is shorter than the length from the hut opening to the partition, several pillars supporting the hut are left, or the outermost part of the hut cover is left as a support, and partitions other than the left parts may be eliminated.

FIG. 26 illustrates the hut cover 2700 in which the partition of the outermost part of the hut cover described with reference to FIG. 25 is left.

Figure 27:
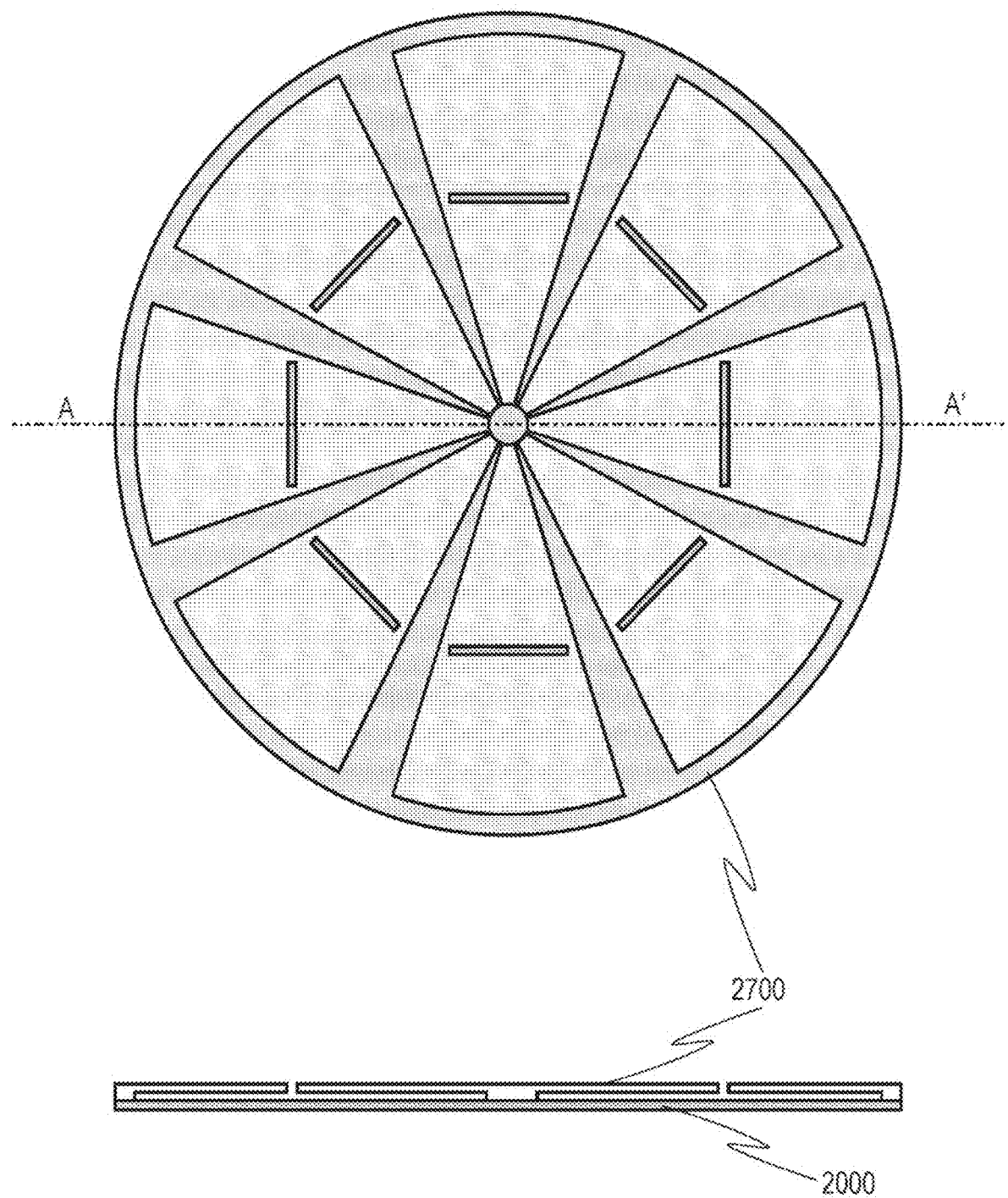
FIG. 27 is a diagram illustrating an example of a substitute sample enabling measurement of a circumferential distribution of a wafer.

FIG. 27 illustrates the hut cover 2700 that can measure the circumferential distribution of the characteristics of the medium such as plasma for processing the to-be-etched film by setting the gap inside the hut cover and the partition of each hut cover to be radial.

In FIG. 27, although the opening has a linear shape, a more accurate circumferential distribution can be measured by making the opening have an arc shape.

In addition, the circumferential distribution at a desired position can be measured by changing the position of the opening in the radial direction.

Furthermore, the circumferential distribution at a plurality of radial positions can be measured by providing a circumferential partition and an opening in each gap.

Figure 28:
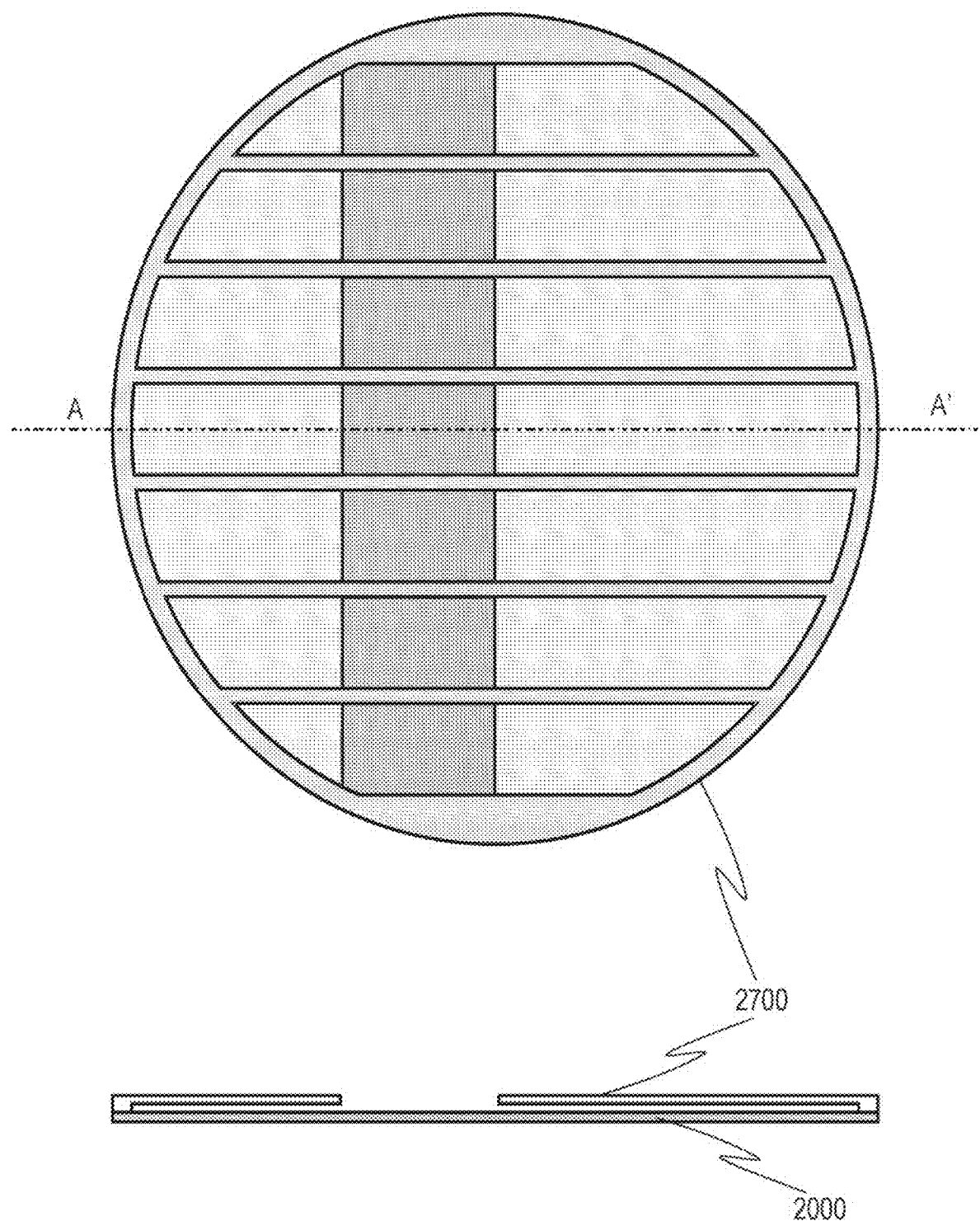
FIG. 28 is a diagram illustrating an example of a substitute sample enabling measurement of an axial distribution of a wafer.

FIG. 28 illustrates the hut cover 2700 provided with gaps in the X-axis direction. When the direction perpendicular to the X axis is the Y-axis direction, the distribution in the Y-axis direction of the characteristics of the medium such as plasma for processing the to-be-etched film can be measured by using the configuration of FIG. 28.

In addition, in FIG. 28, the etching amount o of the opening portion, that is, the outside of the hut, can be obtained by increasing the width of the opening.

Furthermore, the processing amount of the to-be-etched film by the medium such as plasma for processing the to-be-etched film in the opening can be obtained by widening the width of the opening.

Since it is necessary to suppress the influence of the reaction between the hut cover and the surrounding medium with respect to the processing characteristics of the to-be-etched film in the opening portion, the size of the opening portion needs to be at least equal to or larger than the hut cover.

In the case of measuring the etching amount by plasma in the opening portion, that is, the outside of the hut, it is necessary to make the size of the opening portion at least three times the sheath thickness so as to avoid the influence of distortion of the sheath formed along the shape of the hut cover.

In order to further suppress the influence of the reaction between the hut cover and the surrounding medium with respect to the processing characteristics of the to-be-etched film in the opening portion, it is desirable that the size of the opening portion be twice or more the size of the hut cover or 10 times or more of the sheath thickness, and more preferably 1 $cm^2$ or more.

The above-described opening portion can be provided in a part of FIGS. 25, 26, and 27. In addition, the characteristics of the opening portion can be measured by enlarging the sizes of the opening portions illustrated in FIGS. 25, 26, and 27.

Figure 29:
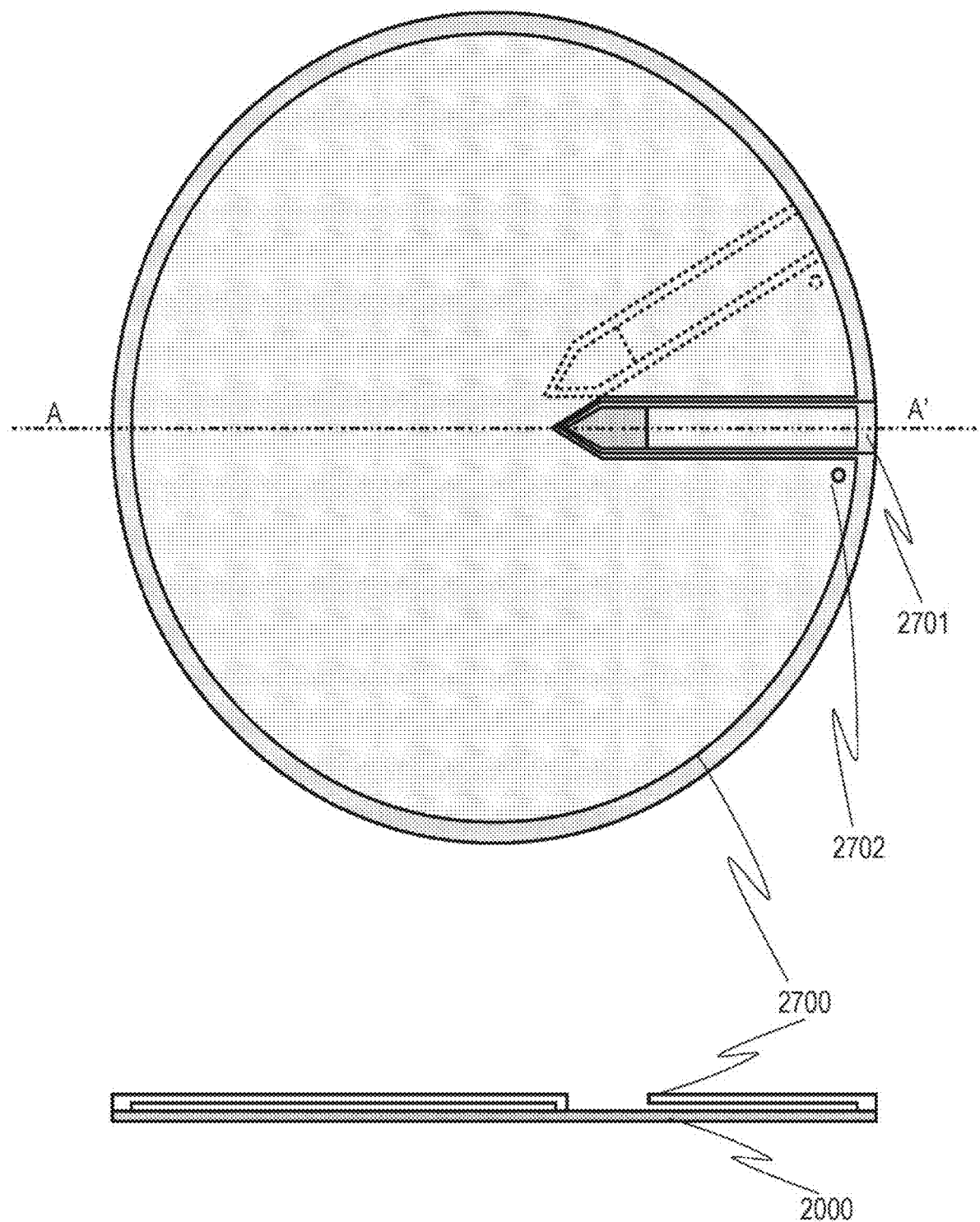
FIG. 29 is a diagram illustrating an example of a substitute sample capable of measuring a substitute sample output a plurality of times.

FIG. 29 illustrates the hut cover 2700 in which one gap and one opening are provided in the hut cover that covers the entire wafer. A portion having the gap and the opening is a measurement unit 2701.

First, a case where the hut cover 2700 and the measurement unit 2701 are integrally formed will be described.

A majority of the inside of the hut cover has a gap to avoid contact between the to-be-etched film and the hut cover. Meanwhile, the processing of the to-be-etched film in the gap in the hut cover other than the measurement unit is prevented by providing partitions between the measurement unit and the hut cover.

With the above configuration, after the substitute sample is used for measurement, the measurement can be performed again by rotating the hut cover 2700 and moving the measurement unit to a portion where the to-be-etched film is not used. Therefore, it is possible to perform measurement a plurality of times by using one wafer with the to-be-etched film.

When the hut cover 2700 rotates, the bottom surface of the partition surrounding the measurement unit 2701 and the to-be-etched film come into contact with each other. In order to avoid damage to the surface of the to-be-etched film due to this contact, it is only necessary to rotate the partition once the hut cover is lifted.

When the hut cover is rotated while sliding, the partition may be fixed to the upper surface of the hut cover, or may extend from the upper surface, so that the partition does not come into contact with the to-be-etched film. In this case, however, the to-be-etched film is sometimes slightly processed on the outer part of the partition around the measurement unit 2701, and thus it is necessary to pay attention to the fact that the number of times of repeated measurement decreases. In order to suppress the processing of the outer portion of the partition as much as possible, it is desirable to minimize the space between the partition and the to-be-etched film just under the partition. In addition, by providing fine portions or dots that are to be in contact with the to-be-etched film on the lower surface of the partition and limiting the contact area with the to-be-etched film, it is possible to suppress the disturbance to the measurement result caused by the partition coming into contact with the to-be-etched film.

In addition, a low friction material or a coating that reduces friction is applied on the lower surface of the partition, thereby suppressing damage to the to-be-etched film by the contact portion. It is possible to suppress a reaction with the medium by reducing the size of the low friction material or the coating. However, it is necessary to pay attention to the fact that the disturbance to the measurement result may become large, depending on a combination of the medium and the material applied to the lower surface of the partition.

Next, the configuration in which the hut cover 2700 and the measurement unit 2701 can be separated will be described. Since the hut cover 2700 and the measurement unit 2701 are separated from each other at the central portion of the partition, the measurement unit 2701 can be replaced with a measurement unit 2701 having a different area, shape, position, and number of the openings, and a different depth and width of the gaps.

When the substitute sample of FIG. 29 is used under reduced pressure, a gas remains in the gaps in the hut cover other than the measurement unit 2701. Thus, if the residual gas is released into the processing chamber, it is impossible to measure the processing characteristics of the target to-be-etched film when the medium such as plasma is generated in the processing chamber. In addition, a pressure due to the residual gas is generated, which may destroy the substitute sample itself. In order to prevent this problem, a vent hole 2702 is provided in a part of the hut cover 2700.

However, since the processing of the to-be-etched film around the vent hole progresses during measurement, the portion cannot be used as the measurement unit. Therefore, it is desirable that the area of the vent hole be equal to or less than several $mm^2$.

In addition, the residual gas can be discharged from the opening by providing the vent hole 2702 in the partition between the hut cover 2700 and the measurement unit 2701 and connecting the gap of the measurement unit to the gap at a position other than the measurement unit.

Figure 30:
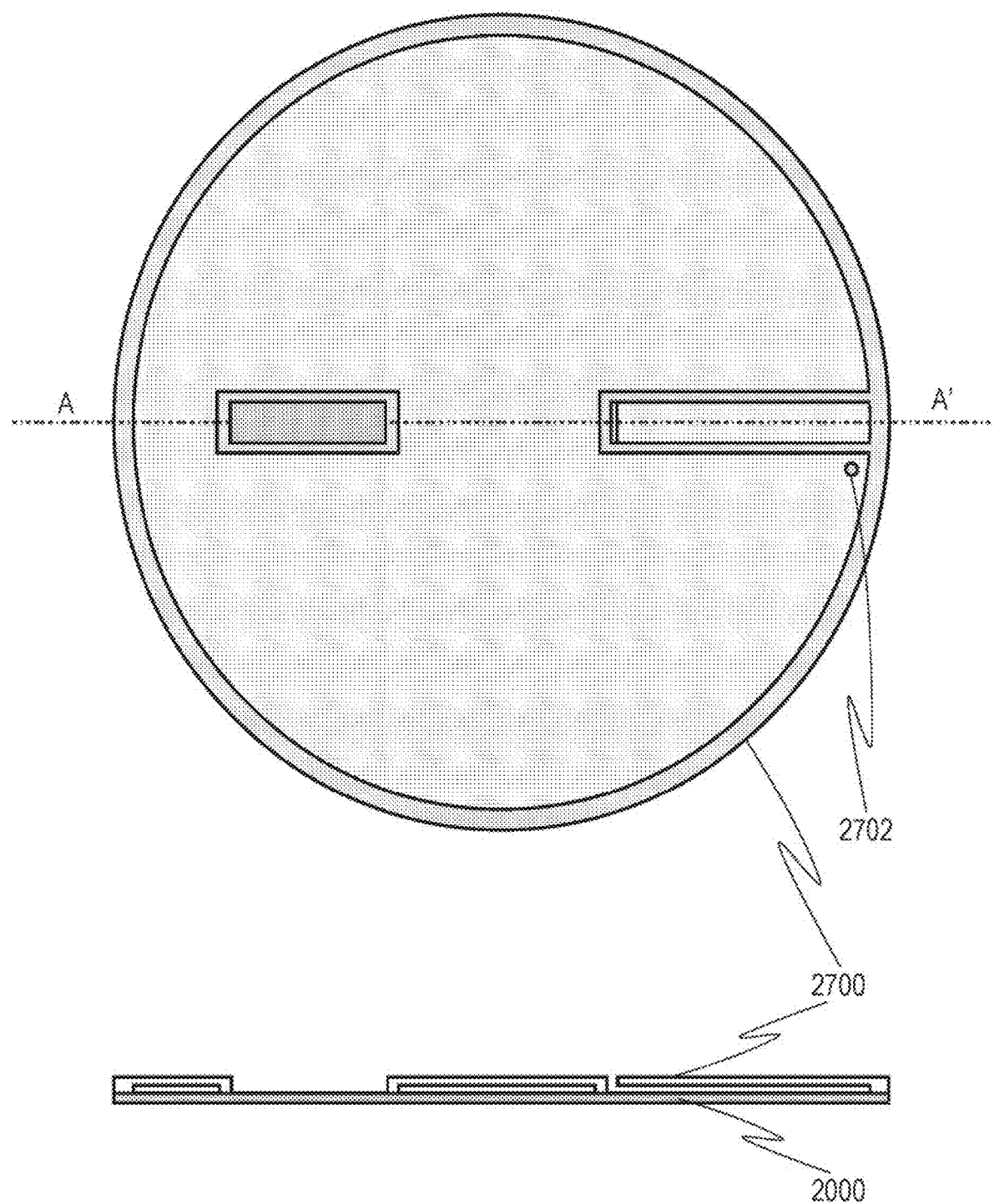
FIG. 30 is a diagram illustrating an example of a substitute sample capable of measuring a substitute sample output a plurality of times.

FIG. 30 illustrates the hut cover 2700 in which the positions of the opening and the measurement unit in FIG. 29 are separately provided. The configuration of FIG. 30 can be used when the sum of the length of the opening and the length of the gap in the lower part of the hut cover in the X-axis direction exceeds the radius of the wafer. In addition, the radial distribution of the opening can be measured. Furthermore, the measurement can be performed even when the characteristic length d of the attenuation inside the hut is long.

Figure 31:
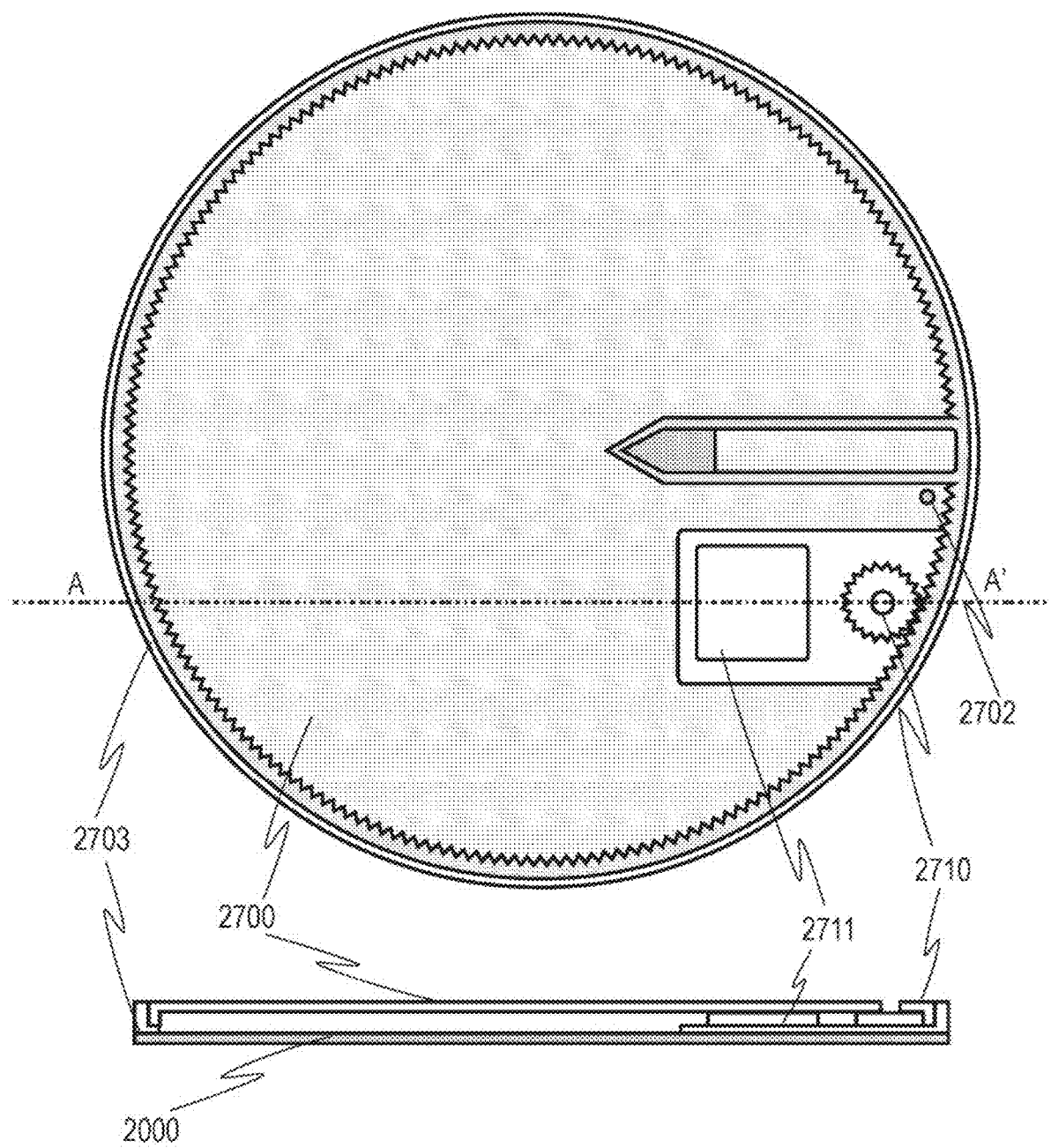
FIG. 31 is a diagram illustrating an example of a hut cover rotation mechanism capable of measuring a substitute sample output a plurality of times.

FIG. 31 illustrates the hut cover 2700 and a rotation mechanism that can automatically rotate the hut cover described in FIG. 29. In FIG. 31, the hut cover includes the hut cover 2700 and an outer periphery support portion 2703 (or a rotation guide portion). A gear is provided on the gap side in the outermost peripheral portion of the hut cover, and the hut cover can be rotated by driving the gear by using a rotation power transmission part 2710 such as a gear.

As the rotation mechanism, the hut cover can be rotated by using the rotation power transmission part 2710 as the above-described gear as a material or a component having a large friction coefficient.

A rotation control system 2711 controls the rotation amount, rotation speed, and rotation start timing and stop timing of the rotation power transmission part 2710. The rotation control system 2711 includes a rotation control board, a memory, an arithmetic device, and a power supply. In addition, it is possible to use a secondary battery as a power supply and provide a contact or a wireless power supply coil for charging the secondary battery. Furthermore, it is possible to provide a wireless communication unit for rewriting a control program of the control board stored in the memory, acquiring log information such as the rotation amount, the rotation speed, the rotation start and stop timing, and the like acquired during the rotation control, and receiving rotation start and stop signals.

The rotation control system 2711 and the rotation power transmission part 2710 are fixed to the extended portion of the outer periphery support portion 2703, so that only the hut cover 2700 can be rotated.

It should be noted that a hut entrance opening/closing part 2712 may be manually rotated without using the rotation control system 2711. In this case, it is possible to rotate the hut cover 2700 by using a driver or the like in the central part of the rotation power transmission part 2710. In addition, a knob may be provided at the center part of the rotation power transmission part 2710, and the hut cover 2700 can be rotated by turning the knob manually.

It should be noted that the outer periphery support portion 2703 can be provided on the outer periphery of the hut cover 2700 in FIGS. 29 and 30, in which case the rotation of the hut cover 2700 can be made smooth.

Figure 32:
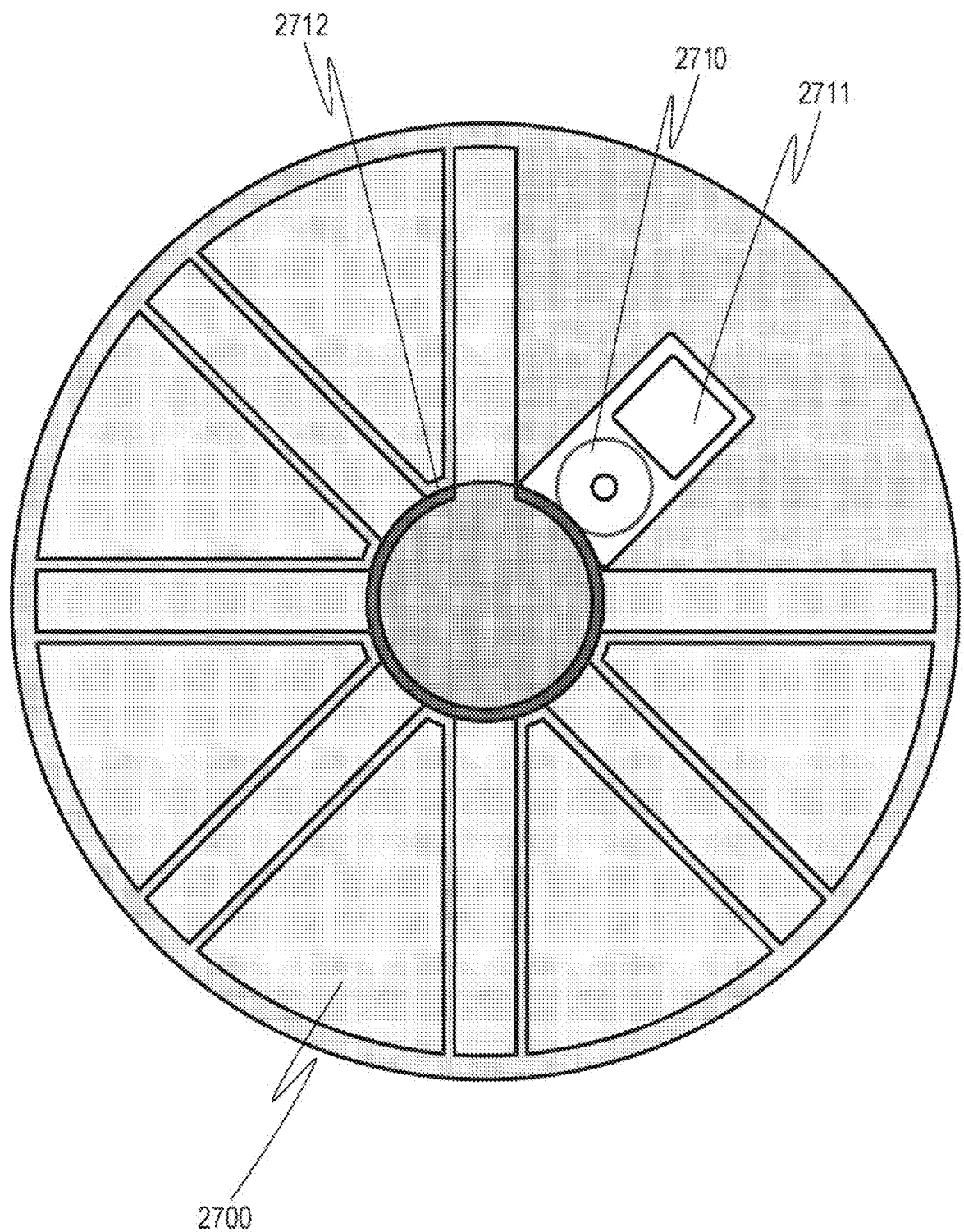
FIG. 32 is a diagram illustrating an example of a hut cover rotation mechanism capable of measuring a substitute sample output a plurality of times.

FIG. 32 illustrates the hut cover 2700 and the rotation mechanism enabling a plurality of times of measurement by rotating the hut entrance opening/closing part 2712 to open and close a plurality of openings of the measurement gaps provided in the hut cover.

The hut entrance opening/closing part 2712 is rotated by using the rotation power transmission part 2710 and the rotation control system 2711. It should be noted that the hut entrance opening/closing part 2712 may be manually rotated without using the rotation control system 2711. The hut cover 2700 can be rotated by using a gear or a material or part having a high friction coefficient in the rotation mechanism of the hut entrance opening/closing part 2712 by the rotation power transmission part 2710.

In the configuration illustrated in FIG. 32, holes are formed in the partition on both sides of the measurement portion and connected to the gap, so that the residual gas in each gap can be exhausted from the gap of the measurement portion in which the hut opening portion is opened. In addition, it is also possible to provide a vent hole in one of the gaps, further provide a hole in the partition on both sides of the measurement portion, and connect the respective gaps, thereby exhausting the residual gas inside each gap from the vent hole.

In the above description, the description has been mainly made in which the grooves or holes are processed in the sample, the sample surface is polished, and the film laminated on the sample surface is polished. However, even when a film or a structure is deposited on the sample, a similar effect can be obtained by setting the thickness of the deposited film and information on the deposited film structure as the sample output and the substitute sample output.

The present invention is not limited to the above-described embodiments and various modifications can be made thereto. In addition, for example, the whole embodiments have been described in detail for easy understanding of the present invention and are not intended to limit the present invention to those necessarily including all the above-described configurations. Furthermore, in a part of configurations of each embodiment, other configurations can be added, removed, or replaced.

All or part of the above-described configurations, functions, processing units, processing means, and the like may be realized by hardware, for example, design of integrated circuits or the like. In addition, the present invention can be realized by a program code of software which realizes the functions of the embodiments. In this case, a storage medium storing the program code is provided to the computer, and a processor included in the computer reads the program code stored in the storage medium. In this case, the program code itself read from the storage medium realizes the functions of the above-described embodiments, and the program code itself and the storage medium storing the program code constitute the present invention. Examples of the storage medium for supplying such program code include a flexible disk, a CD-ROM, a DVD-ROM, a hard disk, a solid state drive (SSD), an optical disk, a magneto-optical disk, a CD-R, a magnetic tape, a non-volatile memory card, and a ROM.

In addition, the program code for realizing the functions described in the present embodiment can be implemented in a wide range of programs or script languages such as assembler, C/C++, perl, Shell, PHP, and Java (registered trademark).

Furthermore, by delivering the program code of the software realizing the functions of the embodiment via a network, the program code is stored in a storage means such as a hard disk or a memory of a computer or a storage medium such as a CD-RW or a CD-R. The processor provided in the computer may then read and execute the program code stored in the storage means or the storage medium.

In the above embodiments, the control line or the information line indicate what is considered to be necessary for the description, and do not necessarily illustrate all the control lines or information lines on the product. All the configurations may be connected to each other.

What is claimed is:

1. A computer for determining a control parameter of processing to be performed on a sample, the computer comprising:
   a memory configured to store:
      a first model indicating a correlation between a first processing output obtained by measuring a first sample used for manufacturing, on which the processing is performed and a second processing output obtained by measuring a second sample that is easier to measure than the first sample and on which the processing is performed, and
      a second model indicating a correlation between the control parameter of the processing performed on the second sample and the second processing output; and
   a processor programmed to:
      determine a target control parameter of the processing performed on the first sample based on a target processing output as the target first processing output, the first model, and
      generate the second model by executing a machine learning algorithm configured via one or more columns of a graphical user interface; wherein
   the computer is configured to control the processing of the first and second samples by controlling a processing device connected to the computer,
   the processing device including one or more of a lithography device, a film-forming device, a pattern processing device, an ion implantation device, a heating device, and a cleaning device,
   the machine learning algorithm is selected from the group consisting of: linear regression, kernel regression, and a neural network, and
   the processing includes modifying a surface of the first and second samples including one or more of adding material to the surface, removing material from the surface, heating the surface, and cleaning the surface.

2. The computer according to claim 1, wherein
   the computer is capable of accessing a database storing data in which the control parameter of the processing performed on the second sample and the second processing output are associated with each other, and
   the second model is generated using the database.

3. The computer according to claim 2, wherein
   the computer determines the second processing output corresponding to the target processing output based on the first model,
   the computer determines an estimated control parameter for obtaining a second processing output corresponding to the target processing output based on the second model, and
   the computer outputs the estimated control parameter as the target control parameter.

4. The computer according to claim 2, wherein
   the second processing output includes measured values of a plurality of elements,
   the computer analyzes a distribution of the second processing output in a space with each of the plurality of elements as an axis with reference to the database,
   the computer determines a second processing output to be added with reference to a result of the analysis,
   the computer determines a new control parameter of the processing performed on the second sample by using the second processing output to be added and the second model,
   the computer inputs the new control parameter to the processing device,
   the computer acquires a new second processing output from the processing device that has performed the processing based on the new control parameter, and
   the computer registers the new control parameter and the new second processing output in the database in association with each other.

5. The computer according to claim 1, wherein
   the first sample and the second sample have a correlation with at least one of a geometric structure and a physical property.

6. A method for determining a control parameter of processing to be performed by a computer on a sample, wherein the computer includes a processor, a memory device connected to the processor, and an interface connected to the processor and connected to an external device, the memory device stores a first model indicating a correlation between a first processing output obtained by measuring a first sample used for manufacturing, on which the processing is performed, and a second processing output obtained by measuring a second sample that is easier to measure than the first sample and on which the processing is performed, the method comprising:
   a first step of generating, by the processor, a second model indicating a correlation between the control parameter of the processing performed on the second sample and the second processing output by executing a machine learning algorithm configured via one or more columns of a graphical user interface, and storing the second model in the memory device; and
   a second step of determining, by the processor, a target control parameter of the processing performed on the first sample based on the target processing output as the target first processing output, the first model, and the second model; wherein
   the computer is configured to control the processing of the first and second samples by controlling the external device,
   the external device including one or more of a lithography device, a film-forming device, a pattern processing device, an ion implantation device, a heating device, and a cleaning device,
   the machine learning algorithm is selected from the group consisting of: linear regression, kernel regression, and a neural network, and
   the processing includes modifying a surface of the first and second samples including one or more of adding material to the surface, removing material from the surface, heating the surface, and cleaning the surface.

7. The method for determining a control parameter of processing according to claim 6, wherein
   the processor is capable of accessing a database storing data in which the control parameter of the processing performed on the second sample and the second processing output are associated with each other, and
   in the first step, the processor generates the second model by executing learning processing using the database.

8. The method for determining a control parameter of processing according to claim 7, wherein the second step comprises:
   determining, by the processor, the second processing output corresponding to the target processing output based on the first model;
   determining, by the processor, an estimated control parameter that is a control parameter capable of obtaining a second processing output corresponding to the target processing output based on the second model; and outputting, by the processor, the estimated control parameter as the target control parameter.

9. The method for determining a control parameter of processing according to claim 7, wherein a processing device configured to perform the processing is connected to the computer, the second processing output includes measured values of a plurality of elements, and the method comprises:

analyzing, by the processor, a distribution of the second processing output in a space with each of the plurality of elements as an axis with reference to the database;

determining, by the processor, a second processing output to be added with reference to a result of the analysis;

determining, by the processor, a new control parameter of the processing performed on the second sample by using the second processing output to be added and the second model;

inputting, by the processor, the new control parameter to the processing device;

acquiring, by the processor, a new second processing output from the processing device that has performed the processing based on the new control parameter, and registering, by the processor, the new control parameter and the new second processing output in the database in association with each other.

10. The method for determining a control parameter of processing according to claim 6, wherein the first sample and the second sample have a correlation with at least one of a geometric structure and a physical property.

* * * * *